United States Patent
Tsai et al.

(10) Patent No.: US 11,980,107 B2
(45) Date of Patent: May 7, 2024

(54) QUANTUM COMPUTING SYSTEM AND METHOD OF USING QUANTUM COMPUTING SYSTEM

(71) Applicant: Tokyo University of Science Foundation, Tokyo (JP)

(72) Inventors: Jaw-Shen Tsai, Tokyo (JP); Hiroto Mukai, Tokyo (JP); Keiichi Sakata, Tokyo (JP)

(73) Assignee: Tokyo University of Science Foundation, Tokyo (JP)

( * ) Notice: Subject to any disclaimer, the term of this patent is extended or adjusted under 35 U.S.C. 154(b) by 735 days.

(21) Appl. No.: 17/053,401

(22) PCT Filed: Apr. 26, 2019

(86) PCT No.: PCT/JP2019/018010
§ 371 (c)(1),
(2) Date: Nov. 6, 2020

(87) PCT Pub. No.: WO2019/216278
PCT Pub. Date: Nov. 14, 2019

(65) Prior Publication Data
US 2021/0233957 A1 Jul. 29, 2021

(30) Foreign Application Priority Data

| May 9, 2018 | (JP) | 2018-090547 |
| Jul. 11, 2018 | (JP) | 2018-131507 |
| Aug. 7, 2018 | (JP) | 2018-148870 |

(51) Int. Cl.
*H10N 69/00* (2023.01)
*G06N 10/00* (2022.01)
(Continued)

(52) U.S. Cl.
CPC ............. *H10N 69/00* (2023.02); *G06N 10/00* (2019.01); *G06N 10/20* (2022.01); *G06N 10/40* (2022.01); *H01L 23/528* (2013.01)

(58) Field of Classification Search
CPC ........ G06N 10/20; G06N 10/00; G06N 10/40; H10N 69/00; H01L 23/528
(Continued)

(56) References Cited

U.S. PATENT DOCUMENTS 7,619,437 B2 * 11/2009 Thom .................... G06N 10/00
257/30

OTHER PUBLICATIONS

R. Barends et al: "Supplementary Information for "Superconducting quantum circuits at the surface code threshold for fault tolerance, Nature, vol. 508, No. 7497, Apr. 23, 2014, pp. 500-503.
(Continued)

*Primary Examiner* — Arnold M Kinkead
(74) *Attorney, Agent, or Firm* — Banner & Witcoff, Ltd.

(57) ABSTRACT

A quantum computing system including plural base configurations each configured including a first quantum bit group configured from first quantum bits arranged so as to form a single column without mutual coupling, a second quantum bit group configured from second quantum bits arranged so as to form a single column with adjacent ones of the second quantum bits coupled together and each of the second quantum bits coupled to the first quantum bit that is arranged in a same row, and a third quantum bit coupled to all of the second quantum bits. The plural base configurations are arranged so as to form a single column with the third quantum bits in adjacent ones of the base configurations coupled together. In a quantum computing circuit configuration, a two-dimensional cluster state or a three-dimensional cluster state is accordingly realized with two-dimensional control wiring, or surface code is accordingly (Continued)

realized with a pseudo two-dimensional superconducting circuit.

15 Claims, 15 Drawing Sheets

(51) Int. Cl.
    *G06N 10/20*         (2022.01)
    *G06N 10/40*         (2022.01)
    *H01L 23/528*       (2006.01)

(58) Field of Classification Search
    USPC .......................................... 257/30; 326/5, 1
    See application file for complete search history.

(56) References Cited

OTHER PUBLICATIONS

Oct. 11, 2021 (EP)—Extended European Search Report (EESR), Application No. 19800485.5.
Kitaev. "Fault-tolerant quantum computation by anyons," Annals of Physics 303, 2 (2003).
Chow et al., "Implementing a strand of a scalable fault-tolerant quantum computing fabric," Nature Communications 5, 4015 (2014).
Kelly et al., "State preservation by repetitive error detection m a superconducting quantum circuit," Nature 519, 66 (2015).
Corcoles et al., "Demonstration of a quantum error detection code using a square lattice of four superconducting qubits," Nature Communications 6, 6979, (2015).
Raussendorf et al., "Fault-Tolerant Quantum Computation with High Threshold in Two Dimensions, " Physical Review Letters 98, 190504, (2007).
Nielsen. "Cluster-state quantum computation," Reports on Mathematical Physics 57, 147, (2006).
Lindner et al., "Proposal for Pulsed On-Demand Sources of Photonic Cluster State Strings," Physical Review Letters 103, 113602 (2009).
Economou et al. "Optically Generated 2-Dimens 10nal Photonic Cluster State from Coupled Quantum Dots," Physical Review Letters 105, 093601 (2010).
Barends et al., "Superconducting quantum circuits at the surface code threshold for fault tolerance," Nature 508, 500 (2014).
Bejanin et al., "Three-Dimensional Wiring for Extensible Quantum Computing: The Quantum Socket," Physical Review Applied 6, 044010 (2016).

* cited by examiner

QUANTUM COMPUTING SYSTEM AND METHOD OF USING QUANTUM COMPUTING SYSTEM

TECHNICAL FIELD

The present invention relates to a quantum computing system and a method of using the quantum computing system.

BACKGROUND ART

Noise present in real quantum systems results in a need for quantum error correction when performing quantum computing. A method utilizing surface code (toric code) is known as one method to perform quantum error correction (see A. Y. Kitaev, "Fault-tolerant quantum computation by anyons" in Annals of Physics 303, 2 (2003)). In particular, in superconducting quantum circuits for which research is progressing fastest, partial implementations of surface code are already being performed (see: J. M. Chow et al., "Implementing a strand of a scalable fault-tolerant quantum computing fabric" in Nature Communications 5, 4015 (2014); J. Kelly et al., "State preservation by repetitive error detection in a superconducting quantum circuit" in Nature 519, 66 (2015); and A. D. Corcoles et al., "Demonstration of a quantum error detection code using a square lattice of four superconducting qubits" in Nature Communications 6, 6979 (2015)).

As a quantum error correction method not using surface code, there is topological one-way quantum computation in which a special state called a three-dimensional cluster state is utilized to perform quantum computation (see R. Raussendorf, J. Harrington, "Fault-Tolerant Quantum Computation with High Threshold in Two Dimensions" in Physical Review Letters 98, 190504 (2007)). Such a cluster state does not arise in a ground state in a physical system of two body interaction, giving rise to the problem of finding a method to generate such a state (M. A. Nielsen, "Cluster-state quantum computation" in Reports on Mathematical Physics 57, 147 (2006)). As a cluster state generation method, there are proposals for a method called a cluster state machine gun that is a system utilizing quantum dots for one-dimensional cluster states and two-dimensional cluster states (see: N. H. Lindner, T. Rudolph, "Proposal for Pulsed On-Demand Sources of Photonic Cluster State Strings" in Physical Review Letters 103, 113602 (2009); and S. E. Economou, N. Lindner, T. Rudolph, "Optically Generated 2-Dimensional Photonic Cluster State from Coupled Quantum Dots" in Physical Review Letters 105, 093601 (2010)).

SUMMARY OF INVENTION

Technical Problem

However, in order to increase the scale of superconducting circuits utilizing surface code as currently proposed, there is a need for a three-dimensional superconducting circuit structure configured from a substrate with quantum bits arrayed two dimensionally thereon, and for control wiring laid perpendicular to the substrate (see R. Barends et al., "Superconducting quantum circuits at the surface code threshold for fault tolerance" in Nature 508, 500 (2014)).

Moreover, there is currently no specific proposal capable of simple configuration for a superconducting circuit using topological one-way quantum computation. Thus current methods mean that it is difficult to produce a large scale superconducting circuit with an error correction function.

Moreover, in order to increase the scale of superconducting circuits utilizing surface code as currently proposed, there is a need for a three-dimensional superconducting circuit structure configured from a substrate with quantum bits arrayed in two dimensions thereon, and for control wiring laid perpendicular to the substrate (see: R. Barends et al., "Superconducting quantum circuits at the surface code threshold for fault tolerance" in Nature 508, 500 (2014); and J. H. Bejanin et al., "Three-Dimensional Wiring for Extensible Quantum Computing: The Quantum Socket" in Physical Review Applied 6, 044010 (2016)).

In order to eliminate the problems described above, an object of the present invention is to provide a quantum computing system capable of realizing cluster states with a two-dimensional superconducting circuit, and to provide a method of using such a quantum computing system.

An object is also to provide a quantum computing system cable of realizing surface code with a pseudo two-dimensional superconducting circuit.

Solution to Problem

A quantum computing system according to a first aspect includes plural first base configurations each configured including a first quantum bit group configured from first quantum bits arranged so as to form a single column with adjacent ones of the first quantum bits coupled together, and a second quantum bit group configured from second quantum bits arranged so as to form a single column without mutual coupling and with each of the second quantum bits coupled to the first quantum bit that is arranged in a same row, and includes plural second base configurations, each of which has a structure in which the first quantum bit group and the second quantum bit group are reversed so as to be symmetrical to one of the plurality of first base configurations, about an axis along an array direction of the first quantum bits and the second quantum bits in the first base configuration. The first base configurations and the second base configurations are in an alternately staggered arrangement with the first base configurations and the second base configurations arranged so as to form respective single columns, and with all adjacent base configurations of the first base configurations and the second base configurations in the alternately staggered arrangement coupled together at each row by coupling between the first quantum bits that are in a same row as each other in the first base configuration and the second base configuration, and with wiring for coupling the first quantum bits together configured as pseudo two-dimensional wiring formed pseudo two-dimensionally such that there is are three-dimensional intersections with other wiring. Control wiring for connecting each of the first quantum bits and each of the second quantum bits to a control device is configured using two-dimensional wiring formed two-dimensionally so as not to intersect with other control wiring or configured as pseudo two-dimensional wiring formed pseudo two-dimensionally so as to have three-dimensional intersections with other control wiring.

A quantum computing system usage method according to a second aspect is method of using the quantum computing system according to the first aspect, wherein a three-dimensional cluster state is generated by performing quantum bit operations according to a sequence described later.

A quantum computing system according to a third aspect includes: a first quantum bit group configured from first quantum bits arranged so as to form a single column without mutual coupling; a second quantum bit group configured from second quantum bits arranged so as to form a single column with adjacent quantum bits of the second quantum bits coupled together and each of the second quantum bits coupled to the first quantum bit that is arranged in a same row; and a third quantum bit group configured from third quantum bits arranged so as to form a single column without mutual coupling and with each of the third quantum bits coupled to the second quantum bit that is arranged in a same row. Control wiring for connecting each of the first quantum bits, each of the second quantum bits, and each of the third quantum bits to a control device is configured using two-dimensional wiring formed two-dimensionally so as not to intersect with other control wiring or configured as pseudo two-dimensional wiring formed pseudo two-dimensionally so as to have three-dimensional intersections with other control wiring.

A quantum computing system usage method according to a fourth aspect is method of using the quantum computing system according to the third aspect, wherein a two-dimensional cluster state is generated by performing quantum bit operations according to a sequence described later.

A quantum computing system according to a fifth aspect includes: a first quantum bit group configured from first quantum bits arranged so as to form a single column without mutual coupling; a second quantum bit group configured from second quantum bits arranged so as to form a single column with adjacent second quantum bits of the second quantum bits coupled together and each of the second quantum bits coupled to the first quantum bit that is arranged in a same row; and a third quantum bit coupled to all of the second quantum bits. Control wiring for connecting each of the first quantum bits, each of the second quantum bits, and the third quantum bit to a control device is configured using two-dimensional wiring formed two-dimensionally so as not to intersect with other control wiring or configured as pseudo two-dimensional wiring formed pseudo two-dimensionally so as to have three-dimensional intersections with other control wiring.

A method of using the quantum computing system according to a sixth aspect is a method of using the quantum computing system according to the fifth aspect, wherein a two-dimensional cluster state is generated by performing quantum bit operations according to a sequence described later.

A quantum computing system according to a seventh aspect includes: a first quantum bit group configured from first quantum bits arranged so as to form a single column with adjacent first quantum bits of the first quantum bits coupled together; a second quantum bit group configured from second quantum bits arranged so as to form a single column without mutual coupling and with each of the second quantum bits coupled to the first quantum bit that is arranged in a same row; and control wiring for connecting each of the first quantum bits and each of the second quantum bits to a control device configured using two-dimensional wiring formed two-dimensionally so as not to intersect with other control wiring.

A quantum computing system usage method according to an eighth aspect is a method of using the quantum computing system according to the seventh aspect, wherein a two-dimensional cluster state is generated by performing quantum bit operations according to a sequence described later.

A quantum computing system according to a ninth aspect includes: a first quantum bit group configured from first quantum bits arranged so as to form a single column with adjacent first quantum bits of the first quantum bits coupled together; a second quantum bit coupled to all of the first quantum bits; and control wiring for connecting each of the first quantum bits and the second quantum bit to a control device. Control wiring is configured as two-dimensional wiring formed two-dimensionally so as not to intersect with other control wiring or configured as pseudo two-dimensional wiring formed pseudo two-dimensionally so as to have three-dimensional intersections with other control wiring.

A quantum computing system usage method according to a tenth aspect is a method of using the quantum computing system according to the ninth aspect, wherein a two-dimensional cluster state is generated by performing quantum bit operations according to a sequence described later.

A quantum computing system according to an eleventh aspect includes: plural base configurations each configured including a first quantum bit group configured from first quantum bits arranged so as to form a single column without mutual coupling, a second quantum bit group configured from second quantum bits arranged so as to form a single column with adjacent second quantum bits of the second quantum bits coupled together and each of the second quantum bits coupled to the first quantum bit that is arranged in a same row, and a third quantum bit coupled to all of the second quantum bits. The plural base configurations are arranged so as to form a single column with the third quantum bits in adjacent base configurations of the base configurations coupled together. Control wiring for connecting each of the first quantum bits, each of the second quantum bits, and the third quantum bit to a control device is configured using two-dimensional wiring formed two-dimensionally so as not to intersect with other control wiring or configured as pseudo two-dimensional wiring formed pseudo two-dimensionally so as to have three-dimensional intersections with other control wiring.

A quantum computing system usage method according to a twelfth aspect is a method of using the quantum computing system according to the eleventh aspect, wherein a three-dimensional cluster state is generated by performing quantum bit operations according to a sequence described later.

A quantum computing system according to a thirteenth aspect includes: plural base configurations each configured including a first quantum bit group configured from first quantum bits arranged so as to form a single column with adjacent first quantum bits of the first quantum bits coupled together, and a second quantum bit coupled to all of the first quantum bits, wherein the plural base configurations are arranged so as to form a single column with the second quantum bits in adjacent base configurations of the base configurations coupled together. Control wiring for connecting each of the first quantum bits and each of the second quantum bit to a control device is configured using two-dimensional wiring formed two-dimensionally so as not to intersect with other control wiring or configured as pseudo two-dimensional wiring formed pseudo two-dimensionally so as to have three-dimensional intersections with other control wiring.

A quantum computing system usage method according to a fourteenth aspect is a method of using the quantum computing system according to the thirteenth aspect, wherein a three-dimensional cluster state is generated by performing quantum bit operations according to a sequence described later.

A quantum computing system according to a fifteenth aspect includes: plural first base configurations each configured including a first quantum bit group configured from first quantum bits arranged so as to form a single column with adjacent ones of the first quantum bits coupled together; and plural second base configurations each configured including a second quantum bit group configured from second quantum bits arranged so as to form a single column with adjacent second quantum bits of the second quantum bits coupled together. The plural-first base configurations are arranged so as to form a single column, and the plural second base configurations are arranged so as to form a single column different from the column of the plural first base configurations. For each coupled pair of the first base configuration and the second base configuration, wiring for coupling together corresponding quantum bits of the first quantum bits and the second quantum bits in each of the pairs is configured as two-dimensional wiring formed two-dimensionally so as not to intersect with other wiring or is configured as pseudo two-dimensional wiring formed pseudo two-dimensionally so as to have three-dimensional intersections with other wiring. Control wiring for connecting each of the first quantum bits and each of the second quantum bits to a control device is configured using two-dimensional wiring formed two-dimensionally so as not to intersect with other control wiring or configured as pseudo two-dimensional wiring formed pseudo two-dimensionally so as to have three-dimensional intersections with other control wiring.

Advantageous Effects

A quantum computing system and a quantum computing system usage method of an aspect of the present invention obtains the advantageous effect of being able to realize a two-dimensional cluster state or a three-dimensional cluster state with a two-dimensional or pseudo two-dimensional superconducting circuit.

A quantum computing system of an aspect of the present invention obtains the advantageous effect of being able to realize surface code with a pseudo two-dimensional superconducting circuit.

DESCRIPTION OF EMBODIMENTS

Detailed explanation follows regarding exemplary embodiments of the present invention, with reference to the drawings.

Outline of Exemplary Embodiments of Present Invention

In the exemplary embodiments of the present invention, topological one-way quantum computation and cluster state machine gun are used to realize a quantum computing system with a two-dimensional superconducting circuit.

Due to the special effects of a quantum dot system being used in a cluster state machine gun method, these special effects are not directly useable in another quantum system such as a superconducting quantum system or the like. However, a similar effect is achievable by mimicking such a system.

A circuit representation of a cluster state machine gun may be configured by repeatedly performing a Y-axis rotation operation on quantum bits QD that correspond to quantum dots, and repeatedly preparing new quantum bits and performing a CNOT gate operation on the quantum bits QD using the quantum bits QD as control bits for the newly prepared quantum bits. A one-dimensional cluster state can be generated by performing such operations (see "SE. Economou, N. Lindner, T. Rudolph, "Optically Generated 2-Dimensional Photonic Cluster State from Coupled Quantum Dots" in Physical Review Letters 105, 093601 (2010)).

First Exemplary Embodiment

System Configuration

Explanation follows regarding a quantum computing system according to a first exemplary embodiment of the present invention.

Figure 1:
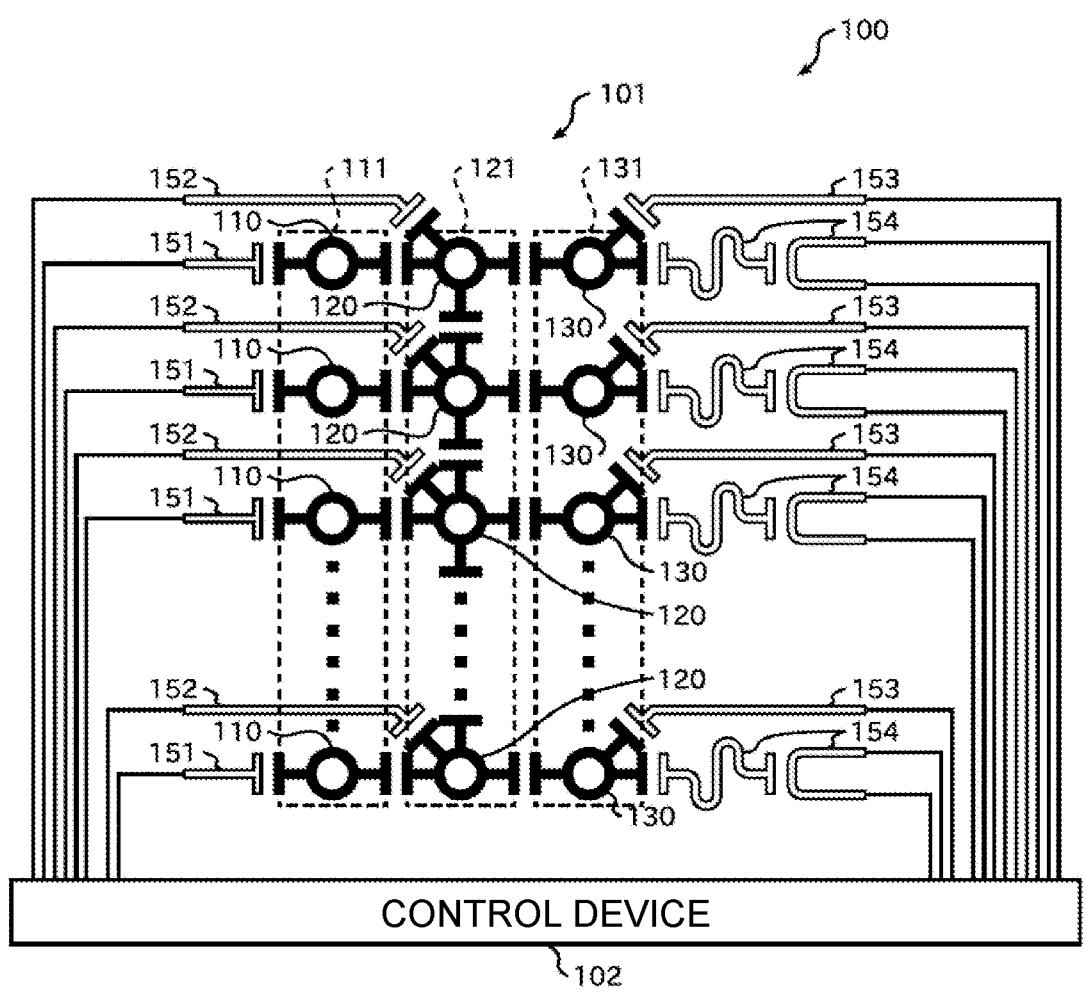
FIG. 1 is a schematic diagram illustrating a configuration of a quantum computing system according to a first exemplary embodiment of the present invention.

As illustrated in FIG. 1, a quantum computing system 100 according to the first exemplary embodiment of the present invention includes a quantum computing circuit 101, and a control device 102.

The quantum computing circuit 101 is configured to include a quantum bit group 111 configured from quantum bits 110 arranged so as to form a single column without mutual coupling, and a quantum bit group 121 configured from quantum bits 120 arranged so as to form a single column, with adjacent ones of the quantum bits 120 coupled together and each coupled to the quantum bit 110 that is arranged in a same row. The quantum computing circuit 101 is also configured including a quantum bit group 131 configured from quantum bits 130 arranged so as to form a single column without being intercoupled, with each of the quantum bits 130 coupled to the quantum bit 120 that is arranged in a same row.

The quantum bits 110 are examples of first quantum bits, the quantum bits 120 are examples of second quantum bits, the quantum bits 130 are examples of third quantum bits, and the quantum bit group 111 is an example of a first quantum bit group. The quantum bit group 121 is an example of a second quantum bit group, and the quantum bit group 131 is an example of a third quantum bit group.

The quantum computing circuit 101 is also connected to the control device 102 through control wiring 151 to 153 and through measurement wiring 154 in order to execute quantum bit operations (first quantum bit gate, second quantum bit gate, quantum bit measurement, and quantum bit initialization operations).

In the present exemplary embodiment, the quantum bits 110, 120, 130 are each, for example, a superconducting quantum bit.

The control wiring 151 to 153 and the measurement wiring 154 are formed in two dimensions so as not to intersect with other wiring, enabling the quantum computing circuit 101 to be configured two-dimensionally. Note that the control wiring 151 to 153 and the measurement wiring 154 may also be formed pseudo two-dimensionally. In such cases, any intersecting portions between the control wiring 151 to 153 and the measurement wiring 154 may be formed as three-dimensional intersections.

Quantum Computing System Operation

Explanation follows regarding operation of the quantum computing system 100 according to the first exemplary embodiment of the present invention.

A two-dimensional cluster state can be generated by quantum bit operation on the quantum computing circuit 101 illustrated in FIG. 1 through the control wiring 151 to 153 and the measurement wiring 154.

Specifically, control is performed according to steps S241 to S248 illustrated in FIG. 2 (illustrating an example of a case in which there are three rows of quantum bits as described later).

Figure 2:
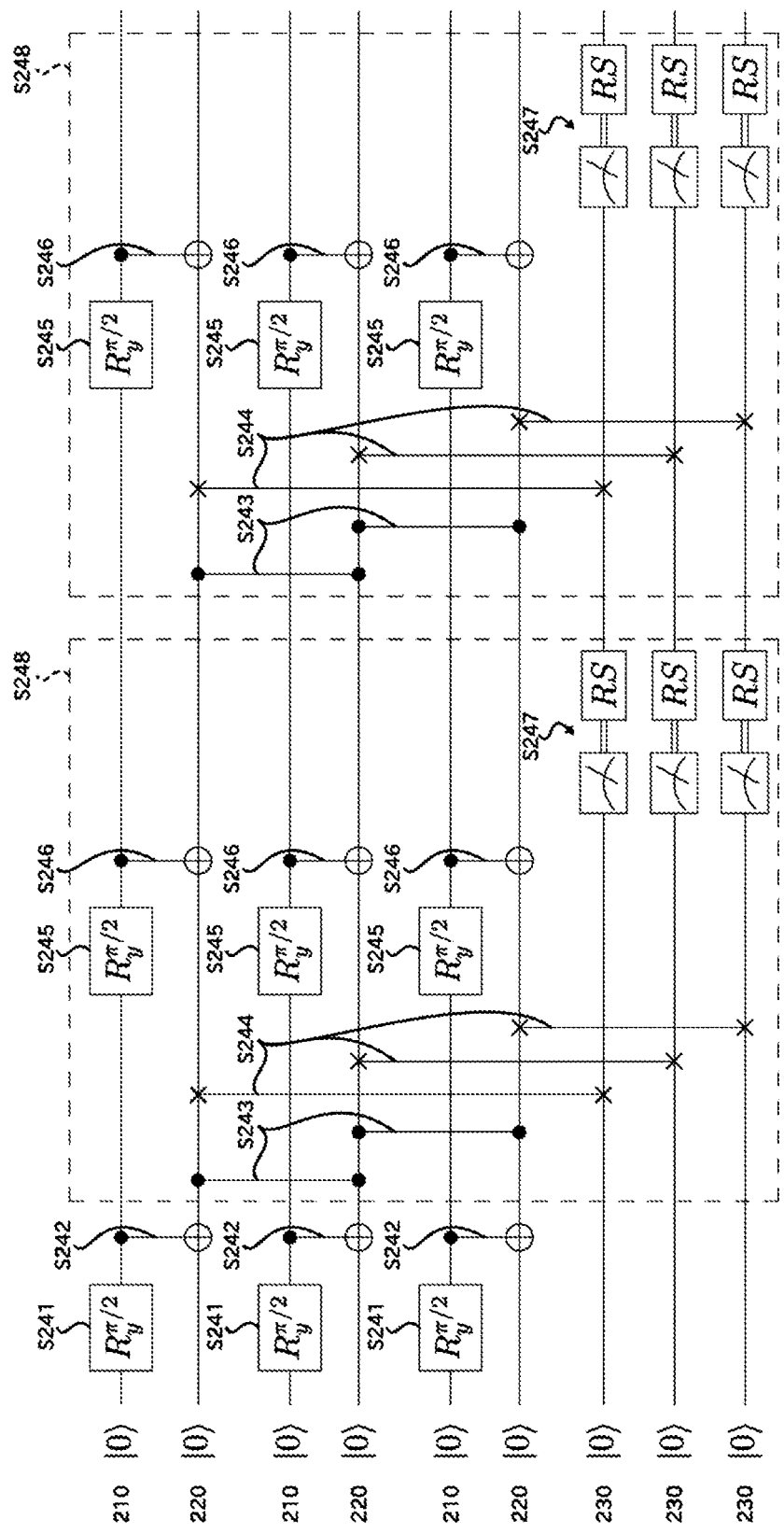
FIG. 2 is a diagram illustrating a control method for a quantum computing system according to the first exemplary embodiment of the present invention.

Note that the quantum bits 110 in FIG. 1 correspond to the quantum bits 210 in FIG. 2, the quantum bits 120 in FIG. 1 correspond to the quantum bits 220 in FIG. 2, and the quantum bits 130 in FIG. 1 correspond to the quantum bits 230 in FIG. 2.

At step S241, a Y-axis rotation operation is performed on each of all the quantum bits 110 to change the state of each of the quantum bits 110.

At step S242, a CNOT gate operation is performed on all of the coupled pairs of quantum bits 110 and quantum bits 120 using the quantum bits 110 as the control bits to change the state of each of the quantum bits 120.

At step S243, a CZ gate operation is performed on all of the pairs of two adjacent quantum bits 120 to change the state of each of the quantum bits 120.

At step S244, a SWAP gate operation is performed on all of the coupled pairs of quantum bits 120 and quantum bits 130 to change the state of the quantum bits 120 and the quantum bits 130.

At step S245, a Y-axis rotation operation is performed on each of all the quantum bits 110 to change the state of each of the quantum bits 110.

At step S246, a CNOT gate operation is performed on all of the coupled pairs of quantum bits 110 and quantum bits 120 using the quantum bits 110 as the control bits to change the state of each of the quantum bits 120.

At step S247, an appropriate ground state is measured for the quantum bits 130 and an initialization operation is performed.

At step S248, above steps S243 to S247 are repeated an appropriate number of times.

A two-dimensional cluster state is generated by the above operations.

As described above, the quantum computing system according to the first exemplary embodiment of the present invention enables a two-dimensional cluster state to be realized at a high precision using two-dimensional control wiring.

Note that the above exemplary embodiment may also be configured by a circuit arranged with a required number sets of quantum bits 110, quantum bits 120, and quantum bits 130.

Second Exemplary Embodiment

System Configuration

Explanation follows regarding a quantum computing system according to a second exemplary embodiment of the present invention.

Figure 3:
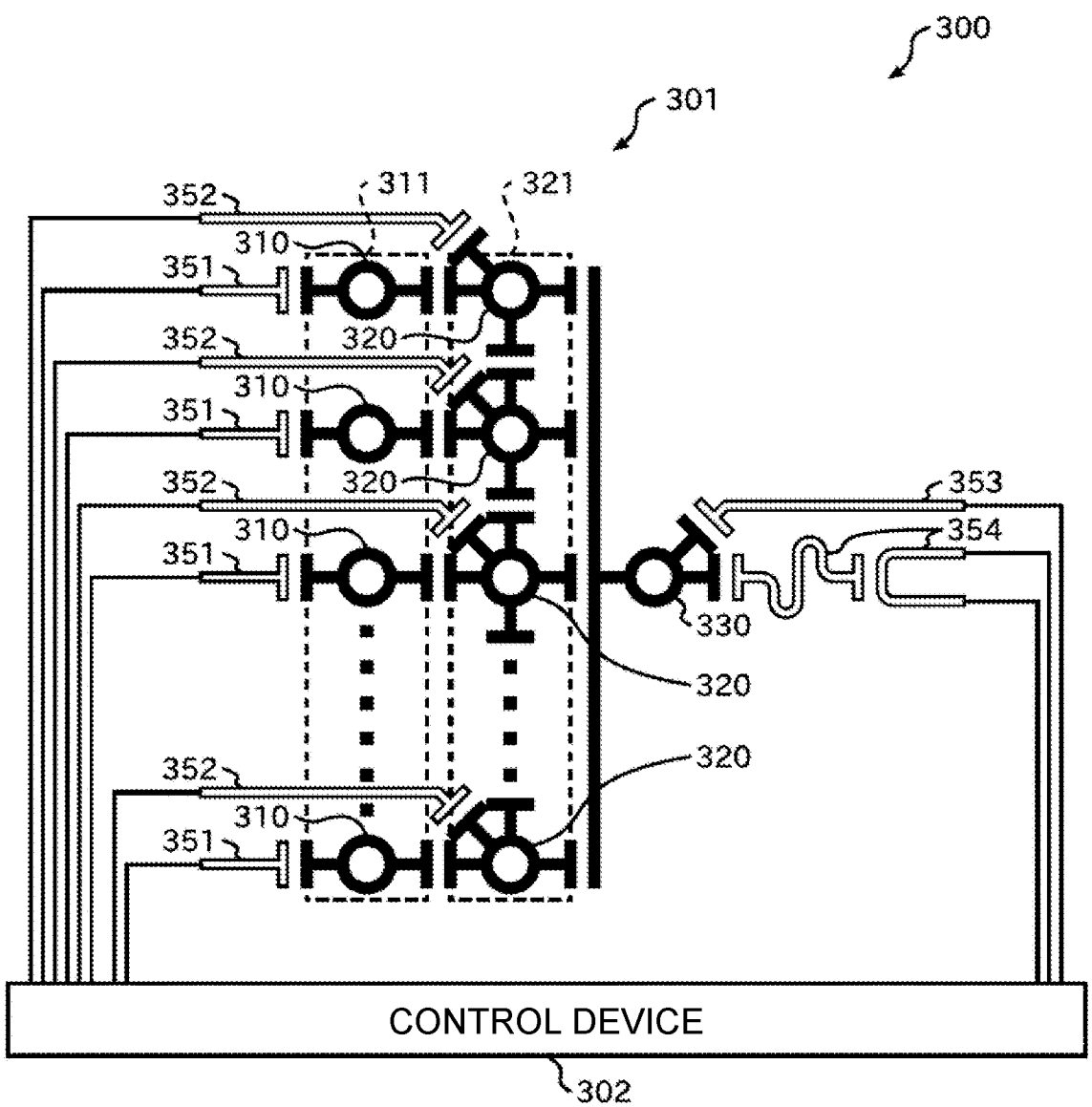
FIG. 3 is a schematic diagram illustrating a configuration of a quantum computing system according to a second exemplary embodiment of the present invention.

As illustrated in FIG. 3, a quantum computing system 300 according to the second exemplary embodiment of the present invention includes a quantum computing circuit 301 and a control device 302.

The quantum computing circuit 301 is configured including a quantum bit group 311 configured from quantum bits 310 arranged so as to form a single column without mutual coupling, and a quantum bit group 321 configured from quantum bits 320 arranged so as to form a single column, with adjacent ones of the quantum bits 320 coupled together and each coupled to the quantum bit 310 that is arranged in a same row. The quantum computing circuit 301 is also configured including a quantum bit 330 coupled to all of the quantum bits 320.

Note the quantum bits 310 are examples of first quantum bits, the quantum bits 320 are examples of second quantum bits, the quantum bit 330 is an example of a third quantum bit, the quantum bit group 311 is an example of a first quantum bit group, and the quantum bit group 321 is an example of a second quantum bit group.

The quantum computing circuit 301 is also connected to the control device 302 through control wiring 351 to 353 and through a measurement wiring 354 in order to execute quantum bit operations (first quantum bit gate, second quantum bit gate, quantum bit measurement, and quantum bit initialization operations).

In the present exemplary embodiment, the quantum bits 310, 320, 330 are each, for example, a superconducting quantum bit.

The control wiring 351 to 353 and the measurement wiring 354 are formed in two dimensions so as not to intersect with other wiring, enabling the quantum computing circuit 301 to be configured two-dimensionally. Note that the control wiring 351 to 353 and the measurement wiring 354 may also be formed pseudo two-dimensionally. In such cases, any intersecting portions between the control wiring 351 to 353 and measurement wiring 354 may be formed as three-dimensional intersections.

Quantum Computing System Operation

Explanation follows regarding operation of the quantum computing system 300 according to the second exemplary embodiment of the present invention.

A two-dimensional cluster state can be generated by quantum bit operation on the quantum computing circuit 301 illustrated in FIG. 3 through the control wiring 351 to 353 and the measurement wiring 354.

Specifically, control is performed according to steps S441 to S449 illustrated in FIG. 4 (illustrating an example of a case in which there are three rows of quantum bits as described later).

Figure 4:
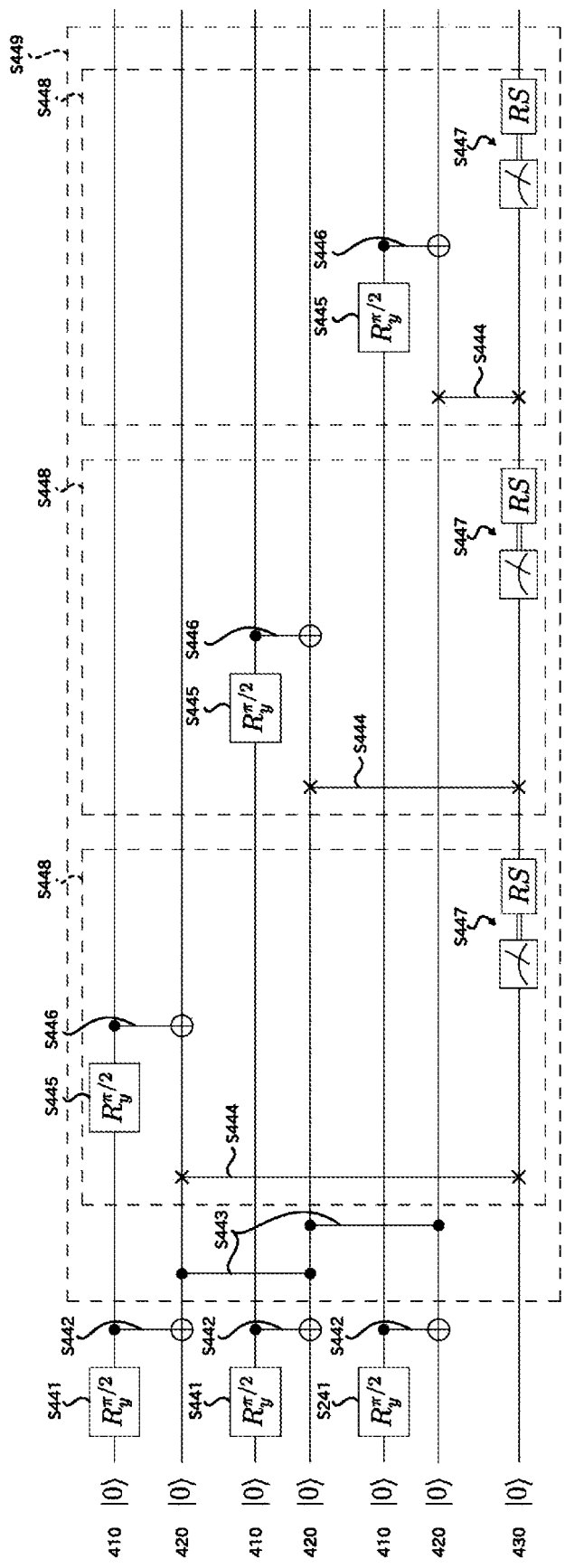
FIG. 4 is a diagram illustrating a control method for a quantum computing system according to the second exemplary embodiment of the present invention.

Note that the quantum bits 310 in FIG. 3 correspond to the quantum bits 410 in FIG. 4, the quantum bits 320 in FIG. 3 correspond to the quantum bits 420 in FIG. 4, and the quantum bit 330 in FIG. 3 corresponds to the quantum bit 430 in FIG. 4.

At step S441, a Y-axis rotation operation is performed on each of all the quantum bits 310 to change the state of each of the quantum bits 310.

Moreover, at step S442, a CNOT gate operation is performed on all of the coupled pairs of quantum bits 310 and quantum bits 320 using the quantum bits 310 as the control bits to change the state of each of the quantum bits 320.

Moreover, at step S443, a CZ gate operation is performed on all of the coupled pairs of two adjacent quantum bits 320 to change the state of each of the quantum bits 120.

Moreover, at step S444, a SWAP gate operation is performed on the quantum bit 320 in the first row and the quantum bit 330 to change the state of the quantum bit 320 and the quantum bit 330.

Moreover, at step S445, a Y-axis rotation operation is performed on the quantum bit 310 in the first row to change the state of the quantum bit 310.

At step S446, a CNOT gate operation is performed on the quantum bit 310 and quantum bit 320 in the first row using the quantum bit 310 as the control bit to change the state of each of the quantum bits 320.

Moreover, at step S447, an appropriate ground is measured for the quantum bit 330 and an initialization operation is performed.

At step S448, above steps S444 to S447 are repeated one row at a time using the pair of the quantum bit 310 and the quantum bit 320 in the second row, then in the third row, etc. until operations have been performed for all of the rows.

At step S449, the above steps S443 to S448 are repeated for an appropriate number of times.

A two-dimensional cluster state is generated by the above operations.

As described above, the quantum computing system according to the second exemplary embodiment of the present invention enables a two-dimensional cluster state to be realized at a high precision using two-dimensional control wiring.

Note that the above exemplary embodiment may also be configured by a circuit arranged with a required number of pairs of the quantum bits 310 and quantum bits 320.

Third Exemplary Embodiment

System Configuration

Explanation follows regarding a quantum computing system 500 according to a third exemplary embodiment of the present invention.

Figure 5:
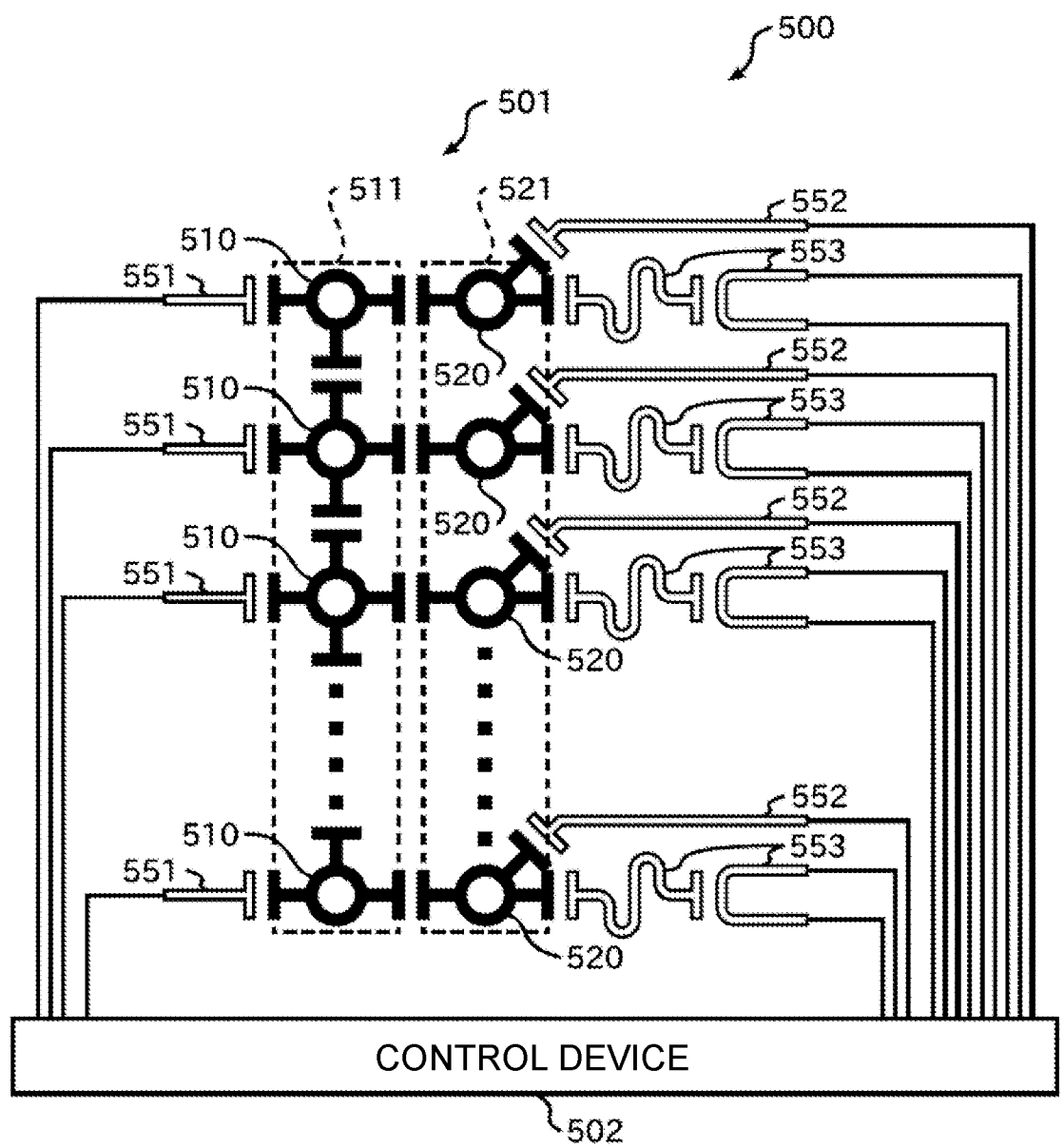
FIG. 5 is a schematic diagram illustrating a configuration of a quantum computing system according to a third exemplary embodiment of the present invention.

As illustrated in FIG. 5, the quantum computing system 500 according to the third exemplary embodiment of the present invention includes a quantum computing circuit 501 and a control device 502.

The quantum computing circuit 501 is configured including a quantum bit group 511 configured from quantum bits 510 arranged so as to form a single column with adjacent quantum bits coupled together, and a quantum bit group 521 configured from quantum bits 520 arranged so as to form a single column, without mutual coupling but with each of the quantum bits 520 coupled to the quantum bit 510 that is arranged in a same row.

Note the quantum bits 510 are examples of first quantum bits, the quantum bits 520 are examples of second quantum bits, the quantum bit group 511 is an example of a first quantum bit group, and the quantum bit group 521 is an example of a second quantum bit group.

The quantum computing circuit 501 is also connected to the control device 502 through control wiring 551, 552 and measurement wiring 553 in order to execute quantum bit operations (first quantum bit gate, second quantum bit gate, quantum bit measurement, and quantum bit initialization operations).

In the present exemplary embodiment, the quantum bits 510, 520 are each, for example, a superconducting quantum bit.

The control wiring 551, 552 and the measurement wiring 553 are formed in two dimensions so as not to intersect with other wiring, enabling the quantum computing circuit 501 to be configured two-dimensionally. Note that the control wiring 551, 552 and the measurement wiring 553 may also be formed pseudo two-dimensionally. In such cases, any intersecting portions between the control wiring 551, 552 and the measurement wiring 553 may be formed as three-dimensional intersections.

Quantum Computing System Operation

Explanation follows regarding operation of the quantum computing system according to the third exemplary embodiment of the present invention.

A two-dimensional cluster state can be generated by quantum bit operation on the quantum computing circuit 501 illustrated in FIG. 5 through the control wiring 551, 552 and the measurement wiring 553.

Specifically, control is performed according to steps S631 to S635 illustrated in FIG. 6 (illustrating an example of a case in which there are three rows of quantum bits as described later).

Figure 6:
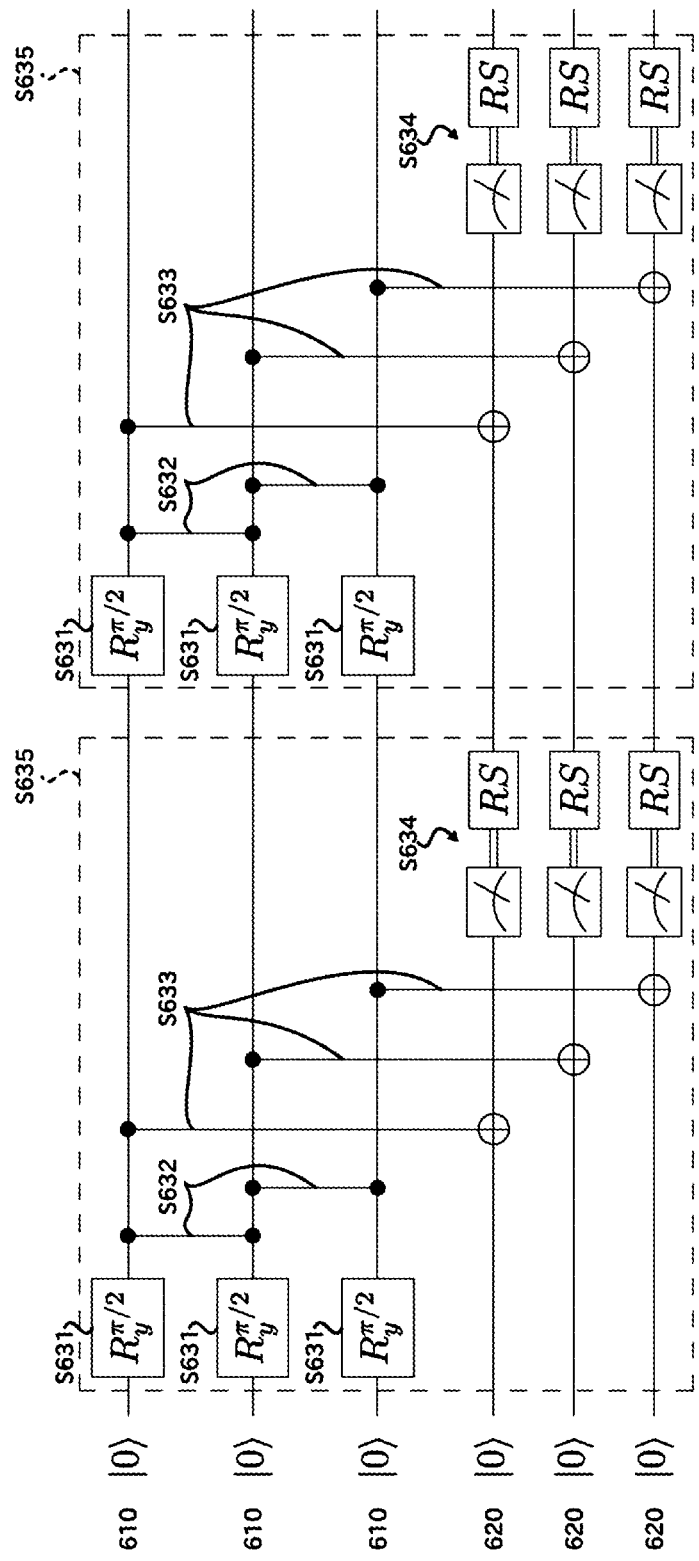
FIG. 6 is a diagram illustrating a control method for a quantum computing system according to the third exemplary embodiment of the present invention.

Note that the quantum bits 510 in FIG. 5 correspond to the quantum bits 610 in FIG. 6 and the quantum bits 520 in FIG. 5 correspond to the quantum bits 620 in FIG. 6.

At step S631, a Y-axis rotation operation is performed on each of all the quantum bits 510 to change the state of each of the quantum bits 510.

Moreover, at step S632, a CZ gate operation is performed on all of the coupled pairs of two adjacent quantum bits 510 to change the state of each of the quantum bits 510.

Moreover, at step S633, a CNOT gate operation is performed on all of the coupled pairs of quantum bits 610 and quantum bits 620 using the quantum bits 610 as the control bits to change the state of each of the quantum bits 610.

Moreover, at step S634, an appropriate ground is measured for the quantum bits 620 and an initialization operation is performed.

At step S635, the above steps S631 to S634 are repeated for an appropriate number of times.

A two-dimensional cluster state is generated by the above operations.

As described above, the quantum computing system according to the third exemplary embodiment of the present invention enables a two-dimensional cluster state to be realized at a high precision using two-dimensional control wiring.

Note that the above exemplary embodiment may also be configured by a circuit arranged with a required number of pairs of the quantum bits 510 and quantum bits 520.

Fourth Exemplary Embodiment

System Configuration

Explanation follows regarding a quantum computing system 700 according to a fourth exemplary embodiment of the present invention.

Figure 7:
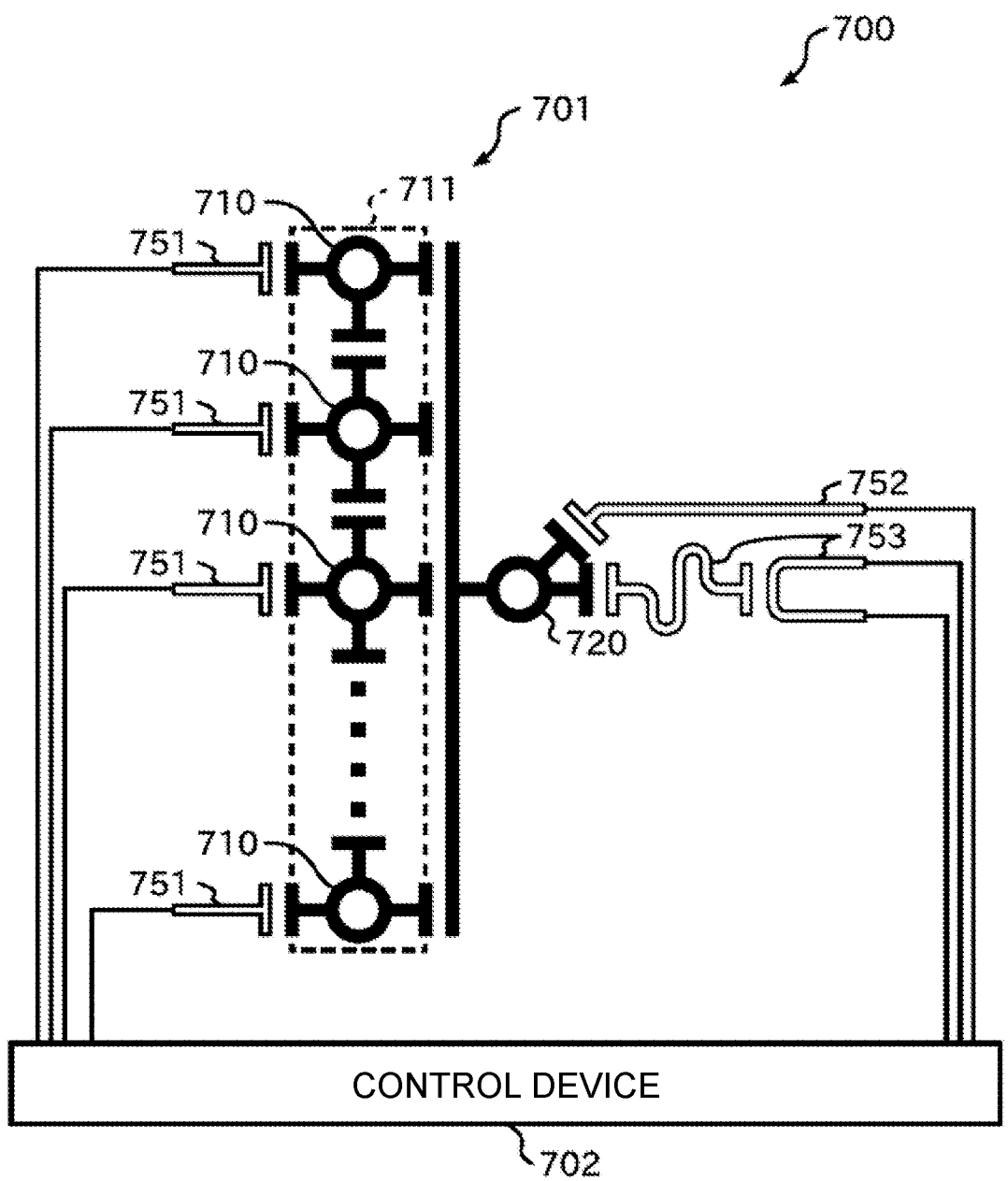
FIG. 7 is a schematic diagram illustrating a configuration of a quantum computing system according to a fourth exemplary embodiment of the present invention.

As illustrated in FIG. 7, a quantum computing system 700 according to the fourth exemplary embodiment of the present invention includes a quantum computing circuit 701 and a control device 702.

The quantum computing circuit 701 is configured including a first quantum bit group 711 configured from quantum bits 710 arranged so as to form a single column with adjacent quantum bits coupled together, and a quantum bit 720 coupled to all of the quantum bits 710.

Note the quantum bits 710 are examples of first quantum bits, the quantum bit 720 is an example of a second quantum bit, and the quantum bit group 711 is an example of a first quantum bit group.

The quantum computing circuit 701 is also connected to the control device 702 through control wiring 751, 752 and measurement wiring 753 in order to execute quantum bit operations (first quantum bit gate, second quantum bit gate, quantum bit measurement, and quantum bit initialization operations).

In the present exemplary embodiment, the quantum bits 710, 720 are each, for example, a superconducting quantum bit.

The control wiring 751, 752 and the measurement wiring 753 are formed in two dimensions so as not to intersect with other wiring, enabling the quantum computing circuit 701 to be configured two-dimensionally. Note that the control wiring 751, 752 and the measurement wiring 753 may also be formed pseudo two-dimensionally. In such cases, any intersecting portions between the control wiring 751, 752 and the measurement wiring 753 may be formed as three-dimensional intersections.

Quantum Computing System Operation

Explanation follows regarding operation of the quantum computing system according to the fourth exemplary embodiment of the present invention.

A two-dimensional cluster state can be generated by quantum bit operation on the quantum computing circuit 701 illustrated in FIG. 7 through the control wiring 751, 752 and the measurement wiring 753.

Specifically, control is performed according to steps S831 to S836 illustrated in FIG. 8 (illustrating an example of a case in which there are three rows of quantum bits as described later).

Figure 8:
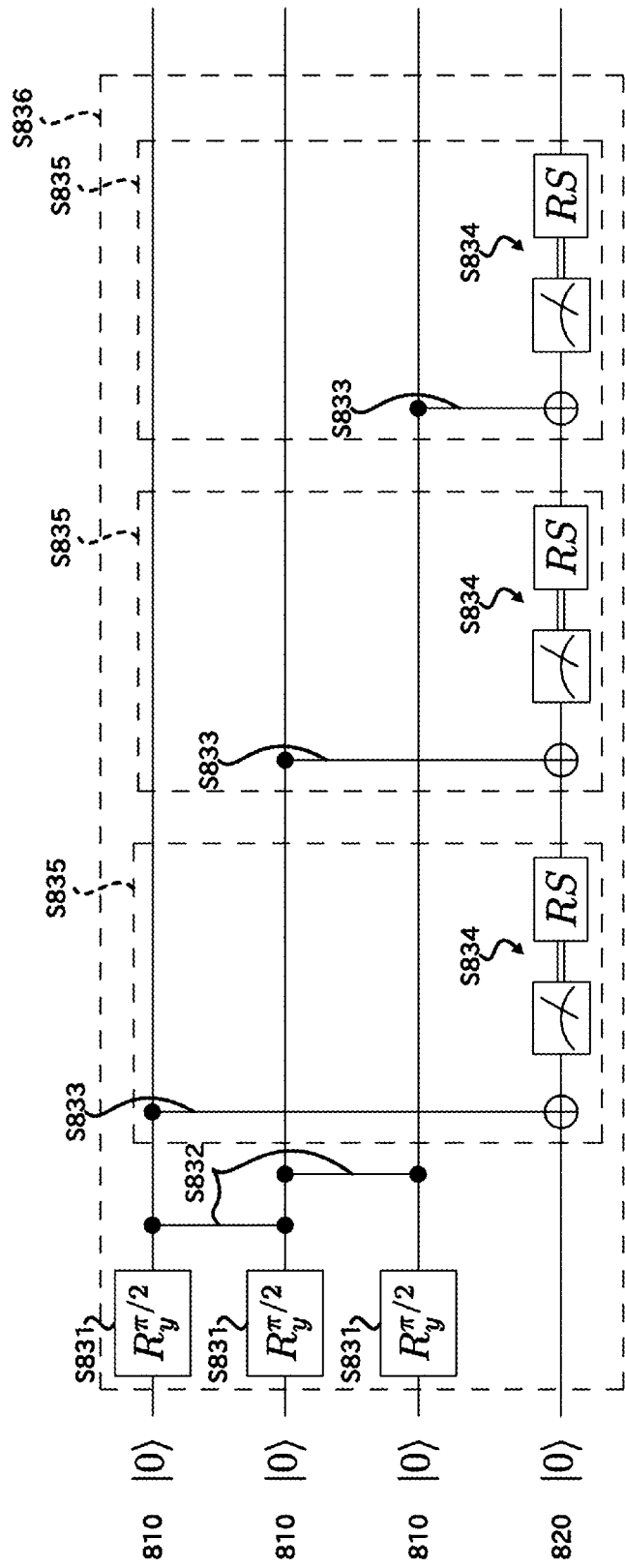
FIG. 8 is a diagram illustrating a control method for a quantum computing system according to the fourth exemplary embodiment of the present invention.

Note that the quantum bits 710 in FIG. 7 correspond to the quantum bits 810 in FIG. 8 and the quantum bit 720 in FIG. 7 corresponds to the quantum bit 820 in FIG. 8.

At step S831, a Y-axis rotation operation is performed on each of all the quantum bits 710 to change the state of each of the quantum bits 710.

Moreover, at step S832, a CZ gate operation is performed on all of the coupled pairs of two adjacent quantum bits 710 to change the state of each of the quantum bits 710.

Moreover, at step S833, a CNOT gate operation is performed on the quantum bit 710 in the first row and the quantum bits 720 using the quantum bit 710 as the control bit to change the state of each of the quantum bit 720.

Moreover, at step S834, an appropriate ground is measured for the quantum bit 720 and an initialization operation is performed.

At step S835, the above steps S833 and S834 are repeated one row at a time using the pair of the quantum bit 720 and the quantum bit 710 in the second row, then in the third row, etc. until operations have been performed for all of the rows.

Moreover, at step S836, above steps S831 to S835 are repeated an appropriate number of times.

A two-dimensional cluster state is generated by the above operations.

As described above, the quantum computing system according to the fourth exemplary embodiment of the present invention enables a two-dimensional cluster state to be realized at a high precision using two-dimensional control wiring.

Note that the above exemplary embodiment may also be configured by a circuit arranged with a required number of the quantum bits 710.

Fifth Exemplary Embodiment

System Configuration

Explanation follows regarding a quantum computing system according to a fifth exemplary embodiment of the present invention.

Figure 9:
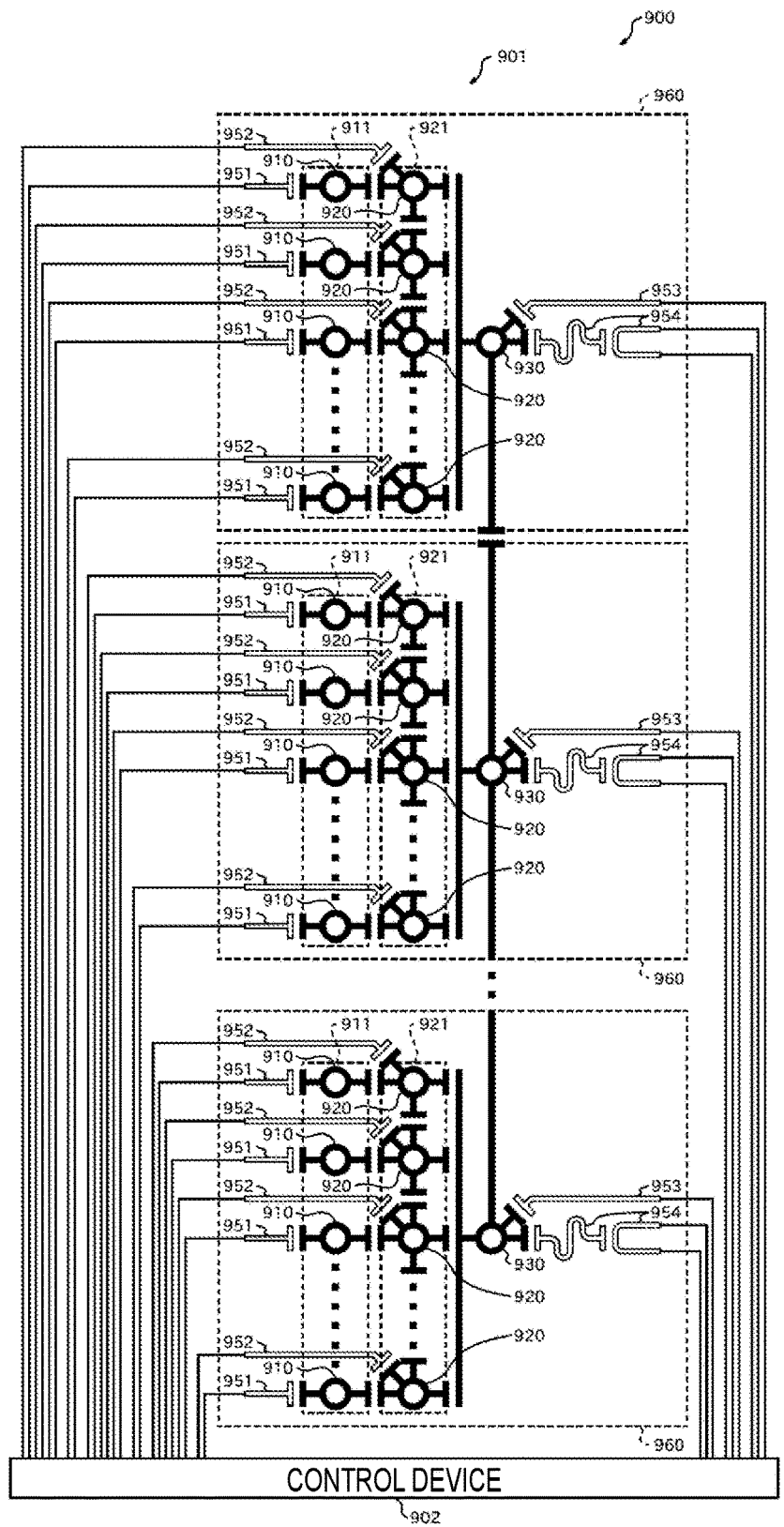
FIG. 9 is a schematic diagram illustrating a configuration of a quantum computing system according to a fifth exemplary embodiment of the present invention.

As illustrated in FIG. 9, a quantum computing system 900 according to the fifth exemplary embodiment of the present invention includes a quantum computing circuit 901 and a control device 902.

The quantum computing circuit 901 is configured including plural base configurations 960. Each of the base configurations 960 is configured including a quantum bit group 911 configured from quantum bits 910 arranged so as to form a single column without mutual coupling, a quantum bit group 921 configured from quantum bits 920 arranged so as to form a single column, with adjacent ones of the quantum bits 920 each coupled together and each of the quantum bits 920 coupled to the quantum bit 910 that is arranged in a same row, a quantum bit 930 coupled to all of the quantum bits 920. The plural base configurations 960 are arranged so as to form a single column, and the quantum bit 930 of adjacent ones of the base configurations 960 are coupled together.

Note the quantum bits 910 are examples of first quantum bits, the quantum bits 920 are examples of second quantum bits, the quantum bit 930 are examples of third quantum bits, the quantum bit group 911 is an example of a first quantum bit group, and the quantum bit group 921 is an example of a second quantum bit group. The base configurations 960 are examples of base configurations.

The quantum computing circuit 901 is also connected to the control device 902 through control wiring 951 to 953 and measurement wiring 954 in order to execute quantum bit operations (first quantum bit gate, second quantum bit gate, quantum bit measurement, and quantum bit initialization operations).

In the present exemplary embodiment, the quantum bits 910, 920, 930 are each, for example, a superconducting quantum bit.

The control wiring 951 to 953 and the measurement wiring 954 are formed in two dimensions so as not to intersect with other wiring, enabling the quantum computing circuit 901 to be configured two-dimensionally. Note that the control wiring 951 to 953 and the measurement wiring 954 may also be formed pseudo two-dimensionally. In such cases, any intersecting portions between the control wiring 951 to 953 and the measurement wiring 954 may be formed as three-dimensional intersections.

Quantum Computing System Operation

Explanation follows regarding operation of the quantum computing system according to the fifth exemplary embodiment of the present invention.

A three-dimensional cluster state can be generated by quantum bit operation on the quantum computing circuit 901 illustrated in FIG. 9 through the control wiring 951 to 953 and the measurement wiring 954.

Specifically, control is performed according to steps S1041 to S1050 illustrated in FIG. 10 (illustrating an example of a case in which there are two rows of quantum bits and there are two of the base configurations 960 as described later).

Figure 10:
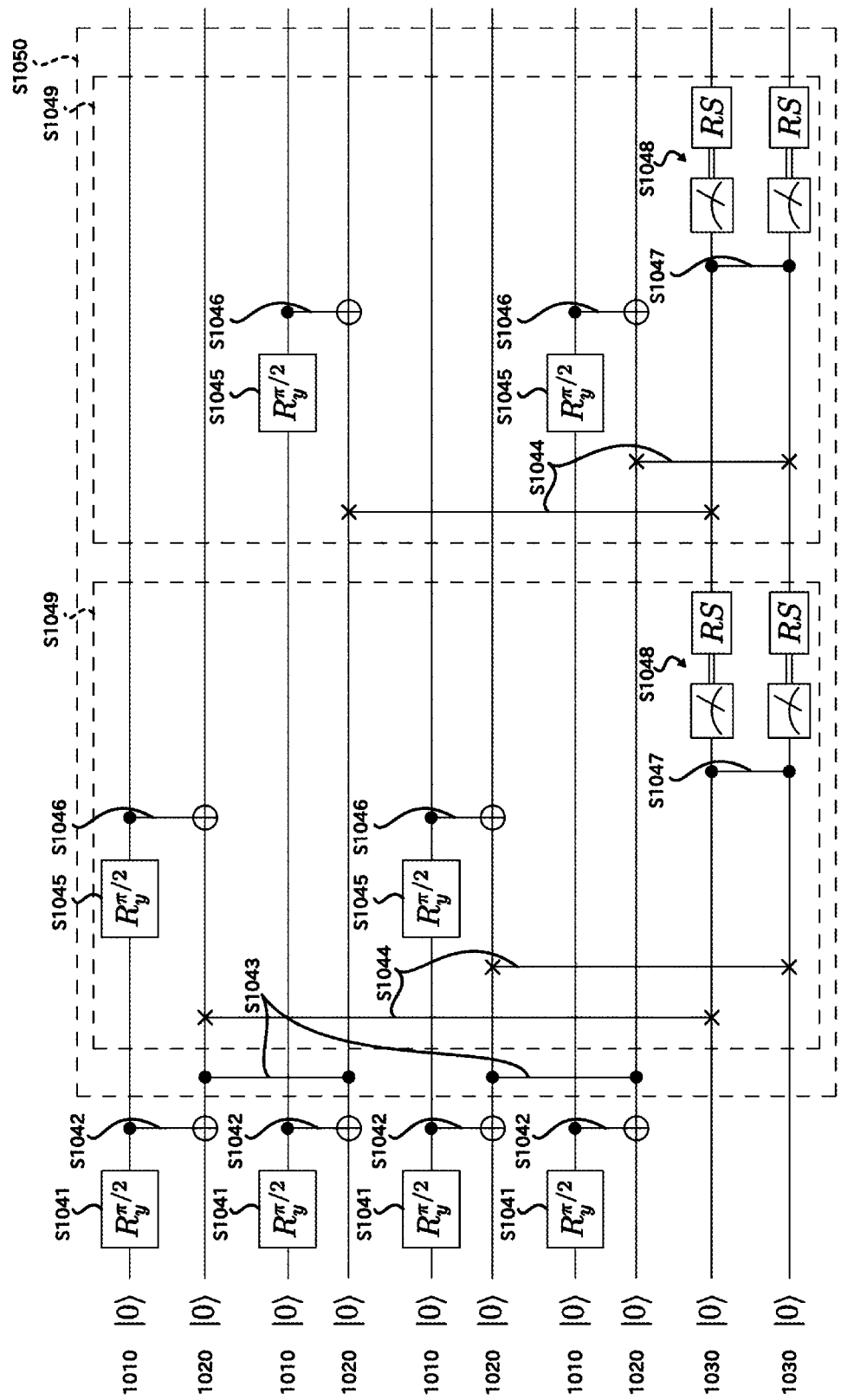
FIG. 10 is a diagram illustrating a control method for a quantum computing system according to the fifth exemplary embodiment of the present invention.

Note that the quantum bits 910 in FIG. 9 correspond to the quantum bits 1010 in FIG. 10, the quantum bits 920 in FIG. 9 correspond to the quantum bits 1020 in FIG. 10, and the quantum bit 930 in FIG. 9 correspond to the quantum bits 1030 in FIG. 10.

At step S1041, a Y-axis rotation operation is performed on each of all the quantum bits 910 to change the state of each of the quantum bits 910.

Moreover, at step S1042, a CNOT gate operation is performed on all the coupled pairs of the quantum bits 910 and the quantum bits 920 using the quantum bits 910 as the control bit to change the state of each of the quantum bits 920.

Moreover, at step S1043, a CZ gate operation is performed on all of the adjacent pairs of two quantum bits 920 to change the state of each of the quantum bits 920.

Moreover, at step S1044, in all of the base configurations 960 a SWAP gate operation is performed on the quantum bit 920 in the first row and the quantum bit 930 to change the state of the quantum bit 920 and the quantum bit 930.

At step S1045, a Y-axis rotation operation is performed on the quantum bit 910 in the first row in all of the base configurations 960 to change the state of the quantum bit 910.

At step S1046, a CNOT gate operation is performed on the quantum bit 910 and the quantum bit 920 in the first row in all of the base configurations 960 using the quantum bit 910 as the control bit to change the state of the quantum bit 920.

Moreover, at step S1047, a CZ gate operation is performed on all of the adjacent pairs of two quantum bits 930 to change the state of each of the quantum bits 930.

At step S1048, an appropriate ground is measured for the quantum bits 930 and an initialization operation is performed.

At step S1049, the above steps S1044 to S1048 are repeated one row at a time using the pair of the quantum bit 910 and the quantum bit 920 in the second row, then those in the third row, etc. until operations have been performed for all of the rows.

Moreover, at step S1050, above steps S1043 to S1049 are repeated an appropriate number of times.

A three-dimensional cluster state is generated by the above operations.

As described above, the quantum computing system according to the fifth exemplary embodiment of the present invention enables a three-dimensional cluster state to be realized at a high precision using two-dimensional control wiring.

Note that the above exemplary embodiment may also be configured by a circuit arranged with a required number of pairs of the quantum bits 910 and the quantum bits 920, or a circuit arranged with a required number of the base configurations 960.

Sixth Exemplary Embodiment

System Configuration

Explanation follows regarding a quantum computing system 1100 according to a sixth exemplary embodiment of the present invention.

Figure 11:
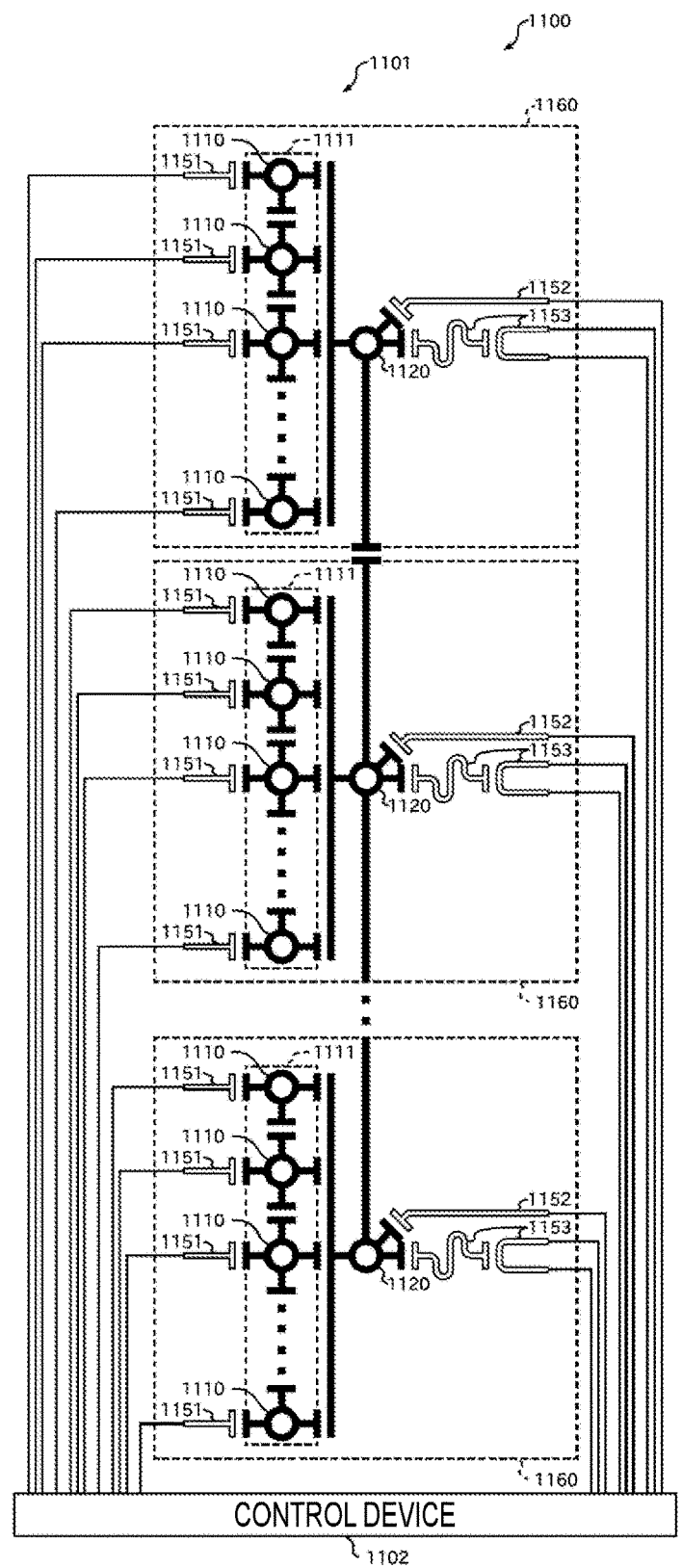
FIG. 11 is a schematic diagram illustrating a configuration of a quantum computing system according to a sixth exemplary embodiment of the present invention.

As illustrated in FIG. 11, a quantum computing system 1100 according to the sixth exemplary embodiment of the present invention includes a quantum computing circuit 1101 and a control device 1102.

The quantum computing circuit 1101 is configured including plural base configurations 1160. Each of the base configurations 1160 is configured including a quantum bit group 1111 configured from quantum bits 1110 arranged so as to form a single column with adjacent quantum bits coupled together, and a quantum bit 1120 coupled to all of the quantum bits 1110. The plural base configurations 1160 are arranged so as to form a single column, and the quantum bits 1120 of adjacent ones of the base configurations 1160 are coupled together.

Note the quantum bits 1110 are examples of first quantum bits, the quantum bit 1120 is an example of a second quantum bit, the quantum bit group 1111 is an example of a first quantum bit group, and the base configurations 1160 are examples of base configurations.

The quantum computing circuit 1101 is also connected to the control device 1102 through control wiring 1151 to 1152 and measurement wiring 1153 in order to execute quantum bit operations (first quantum bit gate, second quantum bit gate, quantum bit measurement, and quantum bit initialization operations).

In the present exemplary embodiment, the quantum bits 1110, 1120 are each, for example, a superconducting quantum bit.

The control wiring 1151 to 1152 and measurement wiring 1153 are formed in two dimensions so as not to intersect with other wiring, enabling the quantum computing circuit 1101 to be configured two-dimensionally. Note that the control wiring 1151 to 1152 and measurement wiring 1153 may also be formed pseudo two-dimensionally. In such cases, any intersecting portions between the control wiring 1151 to 1152 and measurement wiring 1153 may be formed as three-dimensional intersections.

Quantum Computing System Operation

Explanation follows regarding operation of the quantum computing system according to the sixth exemplary embodiment of the present invention.

A three-dimensional cluster state can be generated by quantum bit operation on the quantum computing circuit 1101 illustrated in FIG. 11 through the control wiring 1151 to 1152 and measurement wiring 1153.

Specifically, control is performed according to steps S1231 to S1237 illustrated in FIG. 12 (illustrating an example of a case in which there are two rows of quantum bits as described later and there are two of the base configurations 1160).

Figure 12:
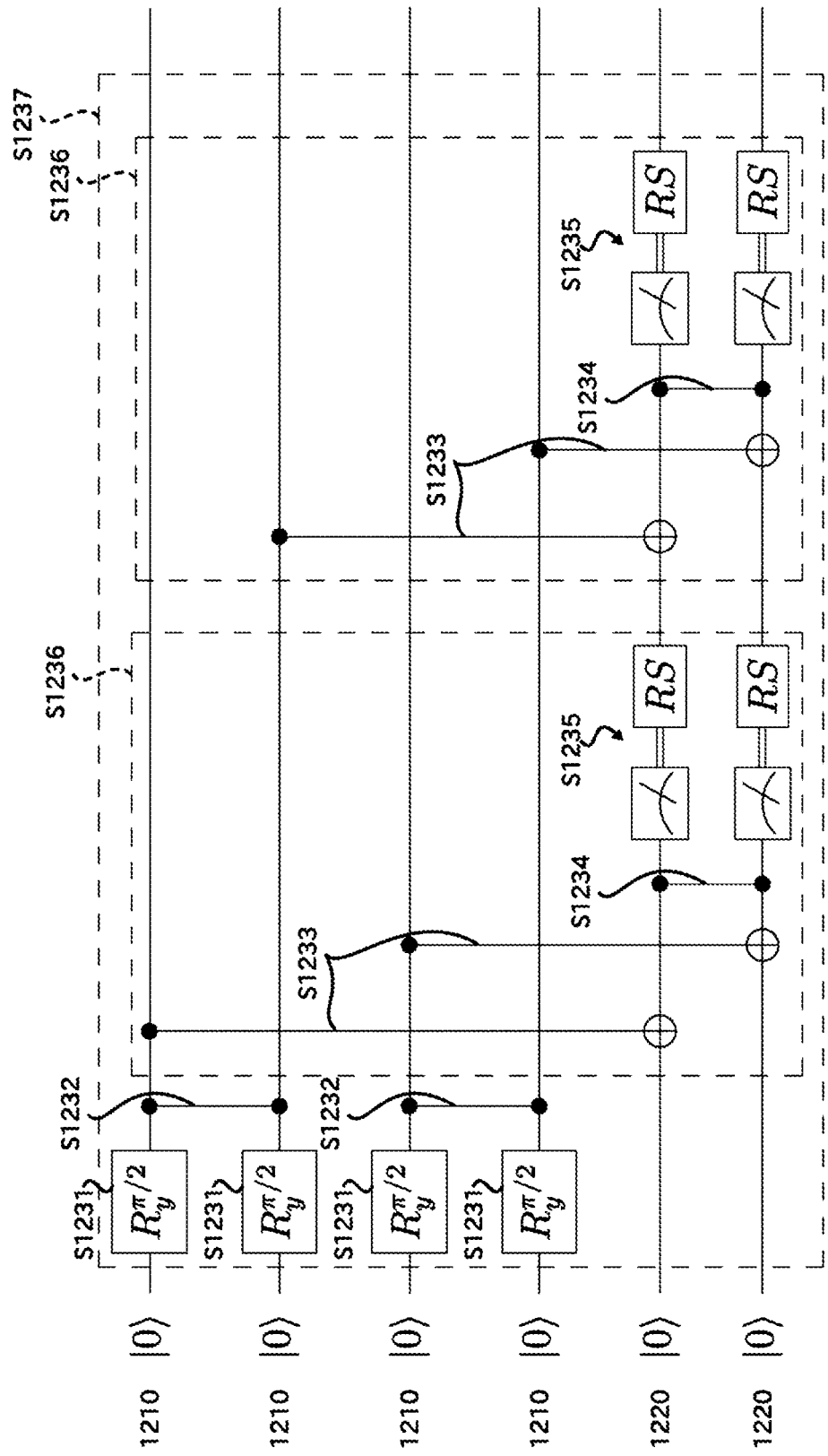
FIG. 12 is a diagram illustrating a control method for a quantum computing system according to the sixth exemplary embodiment of the present invention.

Note that the quantum bits 1110 in FIG. 11 correspond to the quantum bits 1210 in FIG. 12, and the quantum bits 1120 in FIG. 11 correspond to the quantum bits 1220 in FIG. 12.

At step S1231, a Y-axis rotation operation is performed on each of all the quantum bits 1110 to change the state of each of the quantum bits 1110.

Moreover, at step S1232, a CZ gate operation is performed on all the adjacent pairs of two quantum bits 1110 to change the state of each of the quantum bits 1110.

Moreover, at step S1233, a CNOT gate operation is performed in all of the base configurations 1160 on the quantum bit 1110 in the first row and the quantum bit 1120 using the quantum bit 1110 as the control bit to change the state of the quantum bit 1120.

Moreover, at step S1234, a CZ gate operation is performed on all of the adjacent pairs of two quantum bits 1120 to change the state of each of the quantum bits 1120.

Moreover, at step S1235, an appropriate ground is measured for all of the quantum bits 1120 and an initialization operation is performed.

At step S1236, the above steps S1233, S1234, S1235 are repeated one row at a time using the quantum bit 1110 in the second row, then in the third row, etc. until operations have been performed for all of the rows.

Moreover, at step S1237, above steps S1231 to S1236 are repeated an appropriate number of times.

A three-dimensional cluster state is generated by the above operations.

As described above, the quantum computing system according to the sixth exemplary embodiment of the present invention enables a three-dimensional cluster state to be realized at a high precision using two-dimensional control wiring.

Note that the above exemplary embodiment may also be configured by a circuit arranged with a required number of the quantum bits 1110, or a circuit arranged with a required number of the base configurations 1160.

Seventh Exemplary Embodiment

System Configuration

Explanation follows regarding a quantum computing system according to a seventh exemplary embodiment of the present invention.

Figure 13:
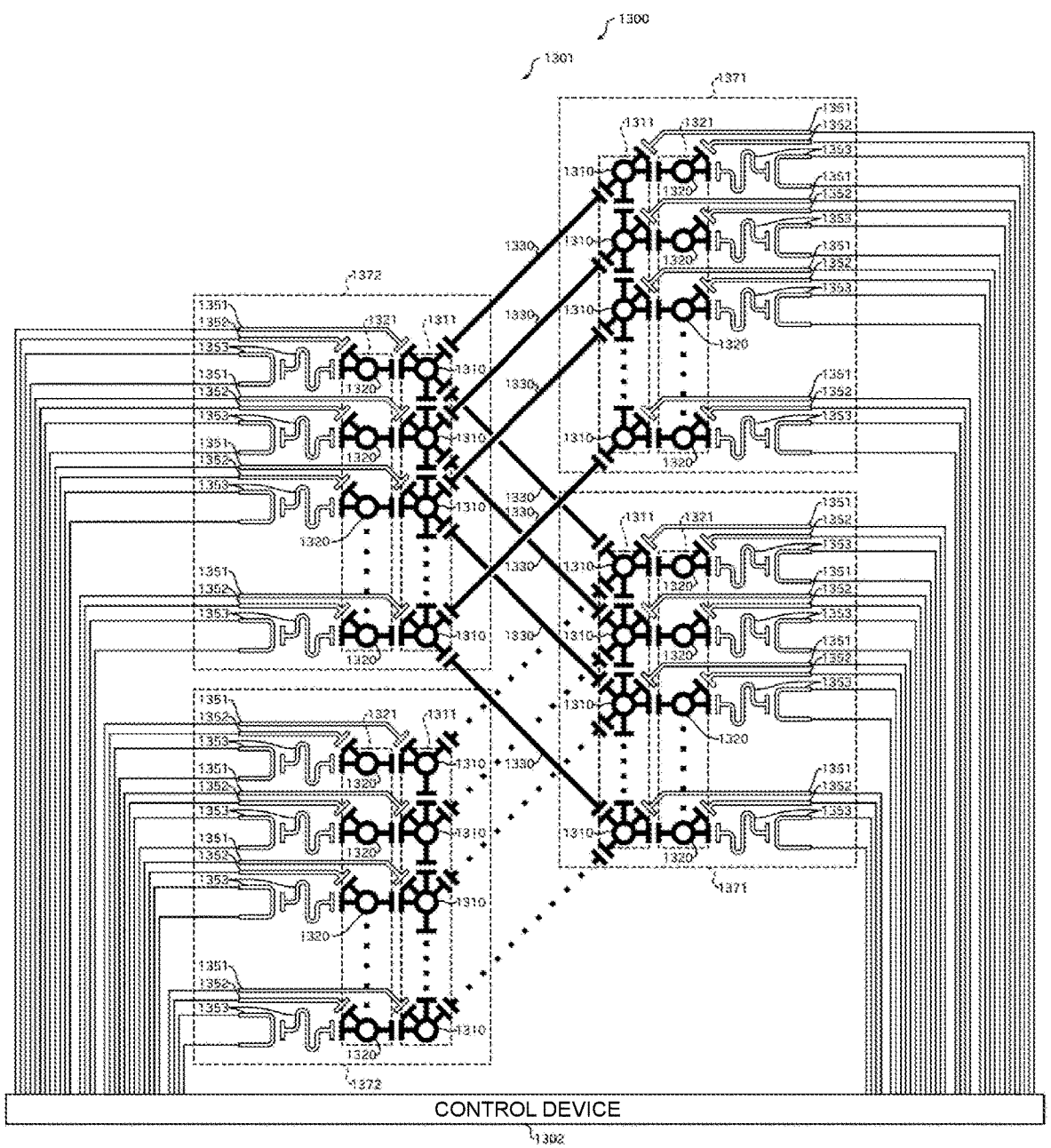
FIG. 13 is a schematic diagram illustrating a configuration of a quantum computing system according to a seventh exemplary embodiment of the present invention.

As illustrated in FIG. 13, a quantum computing system 1300 according to the seventh exemplary embodiment of the present invention includes a quantum computing circuit 1301 and a control device 1302.

The quantum computing circuit 1301 is configured including plural base configurations 1371. Each of the base configurations 1371 is configured including a quantum bit group 1311 configured from quantum bits 1310 arranged so as to form a single column with adjacent quantum bits 1310 coupled together, and a quantum bit group 1321 configured from quantum bits 1320 arranged so as to form a single column without mutual coupling but with each of the quantum bits 1320 coupled to the adjacent quantum bits 1310 that is arranged in a same row. The quantum computing circuit 1301 also includes plural base configurations 1372 having a reversed structure that is a left-right symmetrical reflection of the base configurations 1371 about an axis along the array direction of the quantum bits 1310 and the quantum bits 1320. The base configurations 1371 and the base configurations 1372 are in an alternately staggered arrangement, with the base configurations 1371 and the base configurations 1372 arranged so as to form respective single columns. All of the base configurations 1371 and the base configurations 1372 that are adjacent are coupled together by coupling between the respective quantum bits 1310 arranged in rows that are the same as each other, in a configuration in which wiring 1330 for coupling between the respective quantum bits 1310 uses pseudo two-dimensional wiring with three-dimensional intersections.

Note the quantum bits 1310 are examples of first quantum bits, the quantum bits 1320 are examples of second quantum bits, the quantum bit group 1311 is an example of a first quantum bit group, and the quantum bit group 1321 is an example of a second quantum bit group. The base configurations 1371 are examples of first base configurations, and the base configurations 1372 are examples of second base configurations.

The quantum computing circuit 1301 is also connected to the control device 1302 through control wiring 1351, 1352 and measurement wiring 1353 in order to execute quantum bit operations (first quantum bit gate, second quantum bit gate, quantum bit measurement, and quantum bit initialization operations).

In the present exemplary embodiment, the quantum bits 1310, 1320 are each, for example, a superconducting quantum bit.

The control wiring 1351, 1352 and measurement wiring 1353 are formed in two dimensions so as not to intersect with other wiring, and employing three-dimensional intersections for the wiring 1330 for coupling between the quantum bits 1310 enables the quantum computing circuit 1301 to be configured pseudo two-dimensionally.

Quantum Computing System Operation

Explanation follows regarding operation of the quantum computing system 1300 according to the seventh exemplary embodiment of the present invention.

A three-dimensional cluster state can be generated by quantum bit operation on the quantum computing circuit 1301 illustrated in FIG. 13 through the control wiring 1351, 1352 and measurement wiring 1353.

Figure 14:
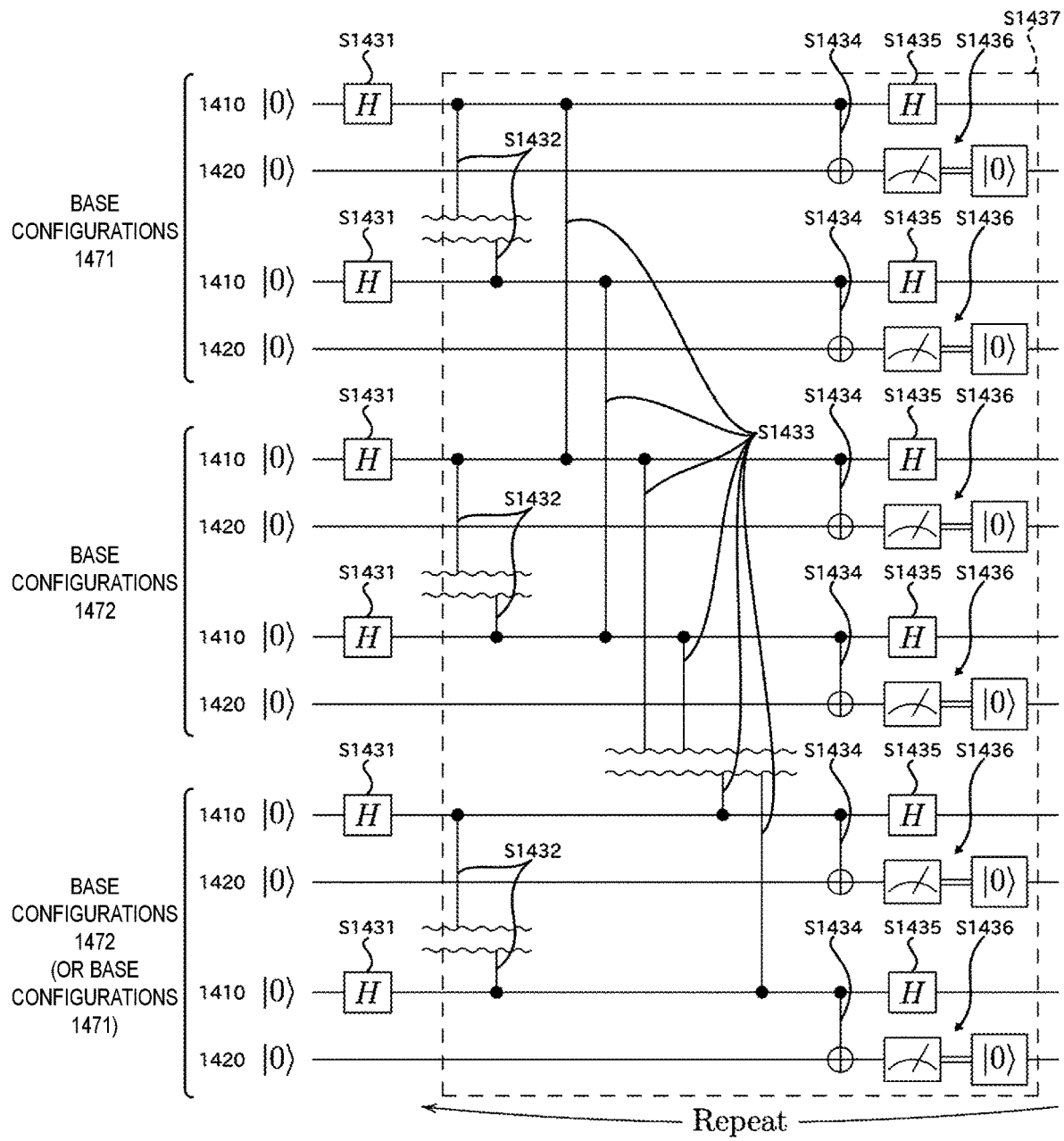
FIG. 14 is a diagram illustrating a control method for a quantum computing system according to the seventh exemplary embodiment of the present invention.

Specifically, control is performed according to steps S1431 to S1437 illustrated in FIG. 14 (in which wavy lines indicate omitted parts of the operation).

Note that the quantum bits 1310 in FIG. 13 correspond to the quantum bits 1410 in FIG. 14, the quantum bits 1320 in FIG. 13 correspond to the quantum bits 1420 in FIG. 14, the base configurations 1371 in FIG. 13 correspond to the base configurations 1471 in FIG. 14, and the base configurations 1372 in FIG. 13 correspond to the base configurations 1472 in FIG. 14.

At step S1431, a Hadamard gate operation is performed on each of all the quantum bits 1410 to change the state of each of the quantum bits 1410.

At step S1432, a CZ gate operation is performed on all the pairs of adjacent quantum bits 1410 in all of the base configurations to change the state of each of the quantum bits 1410.

Moreover, at step S1433, a CZ gate operation is performed on all the adjacent pairs of quantum bits 1410 that are coupled across between the base configurations to change the state of each of the quantum bits 1410.

Moreover, at step S1434, a CNOT gate operation is performed in all of the coupled pairs of quantum bits 1410 and quantum bits 1420 using the quantum bits 1410 as the control bits to change the state of the quantum bits 1420.

Moreover, at step S1435, a Hadamard gate operation is performed on all of the two quantum bits 1410 to change the state of each of the quantum bits 1410.

At step S1436, an appropriate ground is measured for all of the quantum bits 1420 and an initialization operation is performed.

Moreover, at step S1437, above steps S1432 to S1436 are repeated an appropriate number of times.

A three-dimensional cluster state is generated by the above operations.

As described above, the quantum computing system according to the seventh exemplary embodiment of the present invention enables a three-dimensional cluster state to be realized at a high precision using pseudo two-dimensional control wiring.

Note that the above exemplary embodiment may also be configured by a circuit arranged with a required number of pairs of the quantum bits 1310 and the quantum bits 1320, or a circuit arranged with a required number of the base configurations 1371 and base configurations 1372.

Note that the present invention is not limited to the exemplary embodiment described above, and various modifications and applications are possible within a scope not departing from the spirit of the invention.

For example, although in the first exemplary embodiment, second exemplary embodiment, third exemplary embodiment, fourth exemplary embodiment, fifth exemplary embodiment, sixth exemplary embodiment, and seventh exemplary embodiment examples have been described of cases in which quantum computing systems are configured by superconducting quantum circuits, there is no limitation thereto. Such quantum computing systems may also configured by photons, semiconductors, and the like.

Eighth Exemplary Embodiment

System Configuration

Explanation follows regarding a quantum computing system according to an eighth exemplary embodiment of the present invention.

Figure 15:
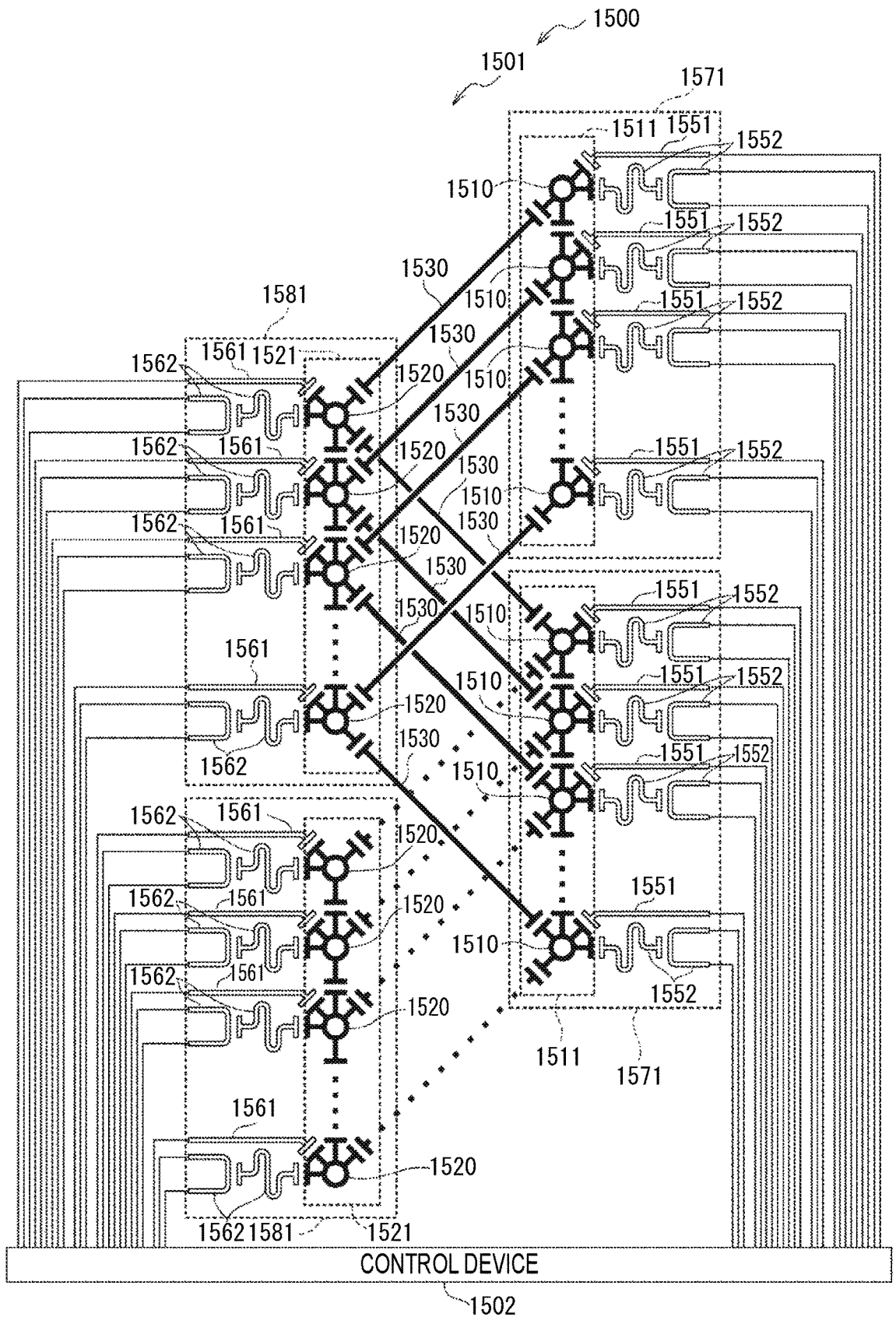
FIG. 15 is a schematic diagram illustrating a configuration of a quantum computing system according to an eighth exemplary embodiment of the present invention.

As illustrated in FIG. 15, a quantum computing system 1500 according to the eighth exemplary embodiment of the present invention includes a quantum computing circuit 1501 and a control device 1502.

The quantum computing circuit 1501 is configured including plural base configurations 1571, with the plural base configurations 1571 arranged so as to form a single column. Each of the base configurations 1571 is configured including a quantum bit group 1511 configured from quantum bits 1510 arranged so as to form a single column with adjacent quantum bits coupled together.

The quantum computing circuit 1501 also includes plural base configurations 1581 that are each configured including a quantum bit group 1521 configured from quantum bits 1520 arranged so as to form a single column with adjacent quantum bits coupled together.

The plural base configurations 1581 are arranged so as to form a single column different from the column of the base configurations 1571.

For each coupled pair of base configuration 1571 and base configuration 1581, wiring 1530 for coupling the corresponding quantum bits 1510 and quantum bits 1520 in each of the respective pairs are formed in two-dimensions, the wiring 1530 are formed with three-dimensional intersections at the intersecting portions of the wiring 1530.

Note the quantum bits 1510 are examples of first quantum bits, the quantum bits 1520 are examples of second quantum bits, the quantum bit group 1511 is an example of a first quantum bit group, and the quantum bit group 1521 is an example of a second quantum bit group. The base configurations 1571 are examples of first base configurations, and the base configurations 1581 are examples of second base configurations.

The quantum computing circuit 1501 is also connected to the control device 1502 through control wiring 1551, 1561 and measurement wiring 1552, 1562 in order to execute quantum bit operations (first quantum bit gate, second quantum bit gate, quantum bit measurement, and quantum bit initialization operations).

In the present exemplary embodiment, the quantum bits 1510, 1520 are each, for example, a superconducting quantum bit.

The control wiring 1551, 1561 and measurement wiring 1552, 1562 are formed in two dimensions, and the wiring 1530 for coupling between the quantum bits 1510 and the quantum bit 1520 are formed in two dimensions, with three-dimensional intersections employed at the intersecting portions of the wiring 1530. This enables the quantum computing circuit 1501 to be configured pseudo two-dimensionally. The control wiring 1551, 1561 and measurement wiring 1552, 1562 may also be formed pseudo two-dimensionally. In such cases, any intersecting portions between the control wiring 1551, 1561 and measurement wiring 1552, 1562 may be formed as three-dimensional intersections.

Quantum Computing System Operation

Explanation follows regarding operation of the quantum computing system 1500 according to the eighth exemplary embodiment of the present invention.

A surface code can be realized by quantum bit operation on the quantum computing circuit 1501 illustrated in FIG. 15 through the control wiring 1551, 1561 and measurement wiring 1552, 1562.

The surface code and a specific control method for quantum computation in surface code is, for example, similar to the method described in "A. G. Fowler et al., "Surface codes: Towards practical large-scale quantum computation" in Physical Review A 86, 032324 (2012)", and so description thereof will be omitted.

Note that the present exemplary embodiment may also be configured by a circuit arranged with a required number of quantum bits 1510 and quantum bits 1520 in the base configurations 1571 and the base configurations 1581 and arranged with the required number of the base configurations 1571 and the base configurations 1581.

As described above, the quantum computing system according to the eighth exemplary embodiment of the present invention enables surface code to be realized at a high precision using pseudo two-dimensional control wiring.

Note that the present invention is not limited by the above exemplary embodiments, and various modifications and applications are possible within a scope not departing from the spirit of the invention.

For example, although examples have been described in the above exemplary embodiment of a case in which a quantum computing system is configured by superconducting quantum circuit, there is no limitation thereto, and the quantum computing system may also configured by photons, semiconductors, and the like.

Moreover, although an example is given of an exemplary embodiment in FIG. 15 in which the base configurations 1571 and the base configurations 1581 are in an alternately staggered arrangement, there is no limit thereto. For example, a configuration may be adopted in which a quantum computing system has a revised layout for the base configurations 1571 and the base configurations 1581 configured by appropriately modifying the wiring 1530.

The entire content of the disclosures of Japanese Patent Application Nos. 2018-090547, 2018-148870 and 2018-131507 are incorporated by reference in the present specification.

All publications, patent applications and technical standards mentioned in the present specification are incorporated by reference in the present specification to the same extent as if each individual publication, patent application, or technical standard was specifically and individually indicated to be incorporated by reference.

The invention claimed is:

1. A quantum computing system comprising:
    a plurality of first base configurations, each including:
        a first quantum bit group configured from first quantum bits arranged so as to form a single column with adjacent ones of the first quantum bits coupled together, and
        a second quantum bit group configured from second quantum bits arranged so as to form a single column without mutual coupling and with each of the second quantum bits coupled to a first quantum bit that is arranged in a same row;
    a plurality of second base configurations, each of which has a structure in which the first quantum bit group and the second quantum bit group are reversed so as to be symmetrical to one of the plurality of first base configurations, about an axis along an array direction of the first quantum bits and the second quantum bits in the first base configuration, wherein:
    the first base configurations and the second base configurations are in an alternately staggered arrangement with the first base configurations and the second base configurations arranged so as to form respective single columns, with all adjacent base configurations of the first base configurations and the second base configurations in the alternately staggered arrangement coupled together at each row, by coupling between first quantum bits that are in a same row as each other in the first base configuration and the second base configuration, and with wiring for coupling the first quantum bits together configured so as to have three-dimensional intersections at intersecting portions with other wiring; and
    control wiring for connecting each of the first quantum bits and each of the second quantum bits to a control device, with control wiring configured as two-dimensional wiring formed two-dimensionally so as not to intersect with other control wiring or configured so as to have three-dimensional intersections at intersecting portions with other control wiring, and
    wherein the first base configurations, the second base configurations, the wiring for coupling the first quantum bits together, and the control wiring are formed two-dimensionally.

2. A method of using the quantum computing system of claim 1, wherein operations are performed on each of the first quantum bits and each of the second quantum bits according to a prescribed sequence in the quantum computing system usage method.

3. A quantum computing system comprising:
    a first quantum bit group configured from first quantum bits arranged so as to form a single column without mutual coupling;
    a second quantum bit group configured from second quantum bits arranged so as to form a single column with adjacent second quantum bits of the second quantum bits coupled together and each of the second quantum bits coupled to a first quantum bit that is arranged in a same row;
    a third quantum bit group configured from third quantum bits arranged so as to form a single column without mutual coupling and with each of the third quantum bits coupled to a second quantum bit that is arranged in a same row; and
    control wiring for connecting each of the first quantum bits, each of the second quantum bits, and each of the third quantum bits to a control device, with control wiring configured as two-dimensional wiring formed two-dimensionally so as not to intersect with other control wiring or configured so as to have three-dimensional intersections at intersecting portions with other control wiring,
    wherein the first quantum bit group, the second quantum bit group, the third quantum bit group, and the control wiring are formed two-dimensionally.

4. A method of using the quantum computing system of claim 3, wherein operations are performed on each of the first quantum bits, each of the second quantum bits, and each of the third quantum bits according to a prescribed sequence in the quantum computing system usage method.

5. A quantum computing system comprising:
    a first quantum bit group configured from first quantum bits arranged so as to form a single column without mutual coupling;
    a second quantum bit group configured from second quantum bits arranged so as to form a single column with adjacent second quantum bits of the second quantum bits coupled together and each of the second quantum bits coupled to a first quantum bit that is arranged in a same row;
    a third quantum bit coupled to all of the second quantum bits; and
    control wiring for connecting each of the first quantum bits, each of the second quantum bits, and the third quantum bit to a control device, with control wiring configured as two-dimensional wiring formed two-dimensionally so as not to intersect with other control wiring or configured so as to have three-dimensional intersections at intersecting portions with other control wiring,
    wherein the first quantum bit group, the second quantum bit group, the third quantum bit group, and the control wiring are formed two-dimensionally.

6. A method of using the quantum computing system of claim 5, wherein operations are performed on each of the first quantum bits, each of the second quantum bits, and the third quantum bit according to a prescribed sequence in the quantum computing system usage method.

7. A quantum computing system comprising:
    a first quantum bit group configured from first quantum bits arranged so as to form a single column with adjacent first quantum bits of the first quantum bits coupled together;
    a second quantum bit group configured from second quantum bits arranged so as to form a single column without mutual coupling and with each of the second quantum bits coupled to a first quantum bit that is arranged in a same row; and
    control wiring for connecting each of the first quantum bits and each of the second quantum bits to a control device, with control wiring configured as two-dimensional wiring formed two-dimensionally so as not to intersect with other control wiring, wherein the first quantum bit group, the second quantum bit group, and the control wiring are formed two-dimensionally.

8. A method of using the quantum computing system of claim 7, wherein operations are performed on each of the first quantum bits and each of the second quantum bits according to a prescribed sequence in the quantum computing system usage method.

9. A quantum computing system comprising:
a first quantum bit group configured from first quantum bits arranged so as to form a single column with adjacent first quantum bits of the first quantum bits coupled together;
a second quantum bit coupled to all of the first quantum bits; and
control wiring for connecting each of the first quantum bits and the second quantum bit to a control device, with control wiring configured as two-dimensional wiring formed two-dimensionally so as not to intersect with other control wiring or configured so as to have three-dimensional intersections at intersecting portions with other control wiring,
wherein the first quantum bit group, the second quantum bit group, and the control wiring are formed two-dimensionally.

10. A method of using the quantum computing system of claim 9, wherein operations are performed on each of the first quantum bits and the second quantum bit according to a prescribed sequence in the quantum computing system usage method.

11. A quantum computing system comprising:
a plurality of base configurations each configured including:
a first quantum bit group configured from first quantum bits arranged so as to form a single column without mutual coupling,
a second quantum bit group configured from second quantum bits arranged so as to form a single column with adjacent second quantum bits of the second quantum bits coupled together and each of the second quantum bits coupled to a first quantum bit that is arranged in a same row, and
a third quantum bit coupled to all of the second quantum bits, wherein:
the plurality of base configurations are arranged so as to form a single column with third quantum bits in adjacent base configurations of the base configurations coupled together;
control wiring for connecting each of the first quantum bits, each of the second quantum bits, and each of the third quantum bits to a control device, with control wiring configured as two-dimensional wiring formed two-dimensionally so as not to intersect with other control wiring or configured so as to have three-dimensional intersections at intersecting portions with other control wiring, and
the plurality of base configurations and the control wiring are formed two-dimensionally.

12. A method of using the quantum computing system of claim 11, wherein operations are performed on each of the first quantum bits, each of the second quantum bits, and each of the third quantum bits according to a prescribed sequence in the quantum computing system usage method.

13. A quantum computing system comprising:
a plurality of base configurations each configured including
a first quantum bit group configured from first quantum bits arranged so as to form a single column with adjacent first quantum bits of the first quantum bits coupled together, and
a second quantum bit coupled to all of the first quantum bits, wherein:
the plurality of base configurations are arranged so as to form a single column with second quantum bits in adjacent base configurations of the base configurations coupled together;
control wiring for connecting each of the first quantum bits and each of the second quantum bits to a control device, with control wiring configured as two-dimensional wiring formed two-dimensionally so as not to intersect with other control wiring or configured so as to have three-dimensional intersections at intersecting portions with other control wiring, and
the plurality of base configurations and the control wiring are formed two-dimensionally.

14. A method of using the quantum computing system of claim 13, wherein operations are performed on each of the first quantum bits and each of the second quantum bits according to a prescribed sequence in the quantum computing system usage method.

15. A quantum computing system comprising:
a plurality of first base configurations each configured including a first quantum bit group configured from first quantum bits arranged so as to form a single column with adjacent first quantum bits of the first quantum bits coupled together;
a plurality of second base configurations each configured including a second quantum bit group configured from second quantum bits arranged so as to form a single column with adjacent second quantum bits of the second quantum bits coupled together, wherein:
the plurality of first base configurations are arranged so as to form a single column, and the plurality of second base configurations are arranged so as to form a single column different from the column of the plurality of first base configurations;
for each pair of a first base configuration and a second base configuration to be coupled, wiring for coupling together corresponding quantum bits of the first quantum bits and the second quantum bits in each of the pairs is configured as two-dimensional wiring formed two-dimensionally so as not to intersect with other wiring or is configured so as to have three-dimensional intersections at intersecting portions with other wiring;
control wiring for connecting each of the first quantum bits and each of the second quantum bits to a control device, with control wiring configured as two-dimensional wiring formed two-dimensionally so as not to intersect with other control wiring or configured so as to have three-dimensional intersections at intersecting portions with other control wiring, and
the plurality of first base configurations, the plurality of second base configurations, the wiring for coupling together corresponding quantum bits, and the control wiring are formed two-dimensionally.

* * * * *